United States Patent
Patel et al.

(10) Patent No.: US 10,756,772 B1
(45) Date of Patent: Aug. 25, 2020

(54) MULTI-MODE MIXER

(71) Applicant: Qualcomm Incorporated, San Diego, CA (US)

(72) Inventors: Chirag Dipak Patel, San Diego, CA (US); Jeremy Goldblatt, Encinitas, CA (US); Yunfei Feng, San Diego, CA (US); Li Liu, San Diego, CA (US); Xinmin Yu, San Diego, CA (US); Aliakbar Homayoun, Alamo, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/418,734

(22) Filed: May 21, 2019

(51) Int. Cl.
- *H04B 1/26* (2006.01)
- *H04B 1/30* (2006.01)
- *H04B 1/16* (2006.01)

(52) U.S. Cl.
CPC ............ *H04B 1/26* (2013.01); *H04B 1/1615* (2013.01); *H04B 1/1638* (2013.01); *H04B 1/30* (2013.01); *H04B 2001/307* (2013.01)

(58) Field of Classification Search
None
See application file for complete search history.

(56) References Cited

U.S. PATENT DOCUMENTS

| | | | |
|---|---|---|---|
| 7,672,658 B2 * | 3/2010 | Chang | H03D 3/007 363/39 |
| 8,095,103 B2 | 1/2012 | Asuri | |
| 8,111,182 B2 * | 2/2012 | Kuttner | H03M 1/685 341/144 |
| 2002/0013137 A1 * | 1/2002 | Asam | H03D 7/1458 455/318 |
| 2006/0019628 A1 * | 1/2006 | Kuei-Ann | H04B 1/44 455/333 |
| 2006/0270367 A1 * | 11/2006 | Burgener | H01Q 23/00 455/127.1 |
| 2009/0258624 A1 * | 10/2009 | Gudem | H04B 1/109 455/234.1 |
| 2010/0214214 A1 * | 8/2010 | Corson | G06F 3/0325 345/158 |
| 2012/0105448 A1 * | 5/2012 | Kim | H04N 13/183 345/419 |
| 2017/0353205 A1 * | 12/2017 | Chakraborty | H04B 1/16 |
| 2019/0199334 A1 * | 6/2019 | Chakraborty | H03K 5/131 |

* cited by examiner

*Primary Examiner* — Lana N Le
(74) *Attorney, Agent, or Firm* — Colby Nipper/Qualcomm

(57) ABSTRACT

An apparatus is disclosed for mixing signals with a multi-mode mixer for frequency translation. In example implementations, a multi-mode mixer includes a supply voltage node, a ground node, a first data signal coupler, and a second data signal coupler. The multi-mode mixer also includes a mixer core and a current control switch. The mixer core is coupled between the first data signal coupler and the second data signal coupler. The current control switch is configured to selectively enable or disable flow of a current through the mixer core. The first data signal coupler, the second data signal coupler, the mixer core, and the current control switch are coupled together in series between the supply voltage node and the ground node.

21 Claims, 12 Drawing Sheets

MULTI-MODE MIXER

TECHNICAL FIELD

This disclosure relates generally to wireless communications with electronic devices and, more specifically, to implementing a multi-mode mixer that can operate in a passive mode or an active mode.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats and other sensors or controllers, automotive electronics, robotics, devices embedded in other machines like refrigerators and industrial tools, Internet of Things (IoT) devices, and so forth. These various electronic devices provide services relating to productivity, remote communication, social interaction, security, safety, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smart phone can transmit a wireless signal to a base station over an air medium as part of an uplink communication to support mobile services. Using a wireless receiver, the smart phone can receive a wireless signal from the base station via the air medium as part of a downlink communication to enable mobile services. With a smart phone, mobile services can include phone and video calls, social media interactions, messaging, watching movies, sharing videos, performing searches, acquiring map information or navigational instructions, locating friends, transferring money, obtaining another service like a car ride, location-based services generally, and so forth.

To provide these types of services, electronic devices typically use a wireless transceiver to communicate wireless signals in accordance with some wireless standard. Examples of wireless standards include an IEEE 802.11 Wi-Fi standard and a Fourth Generation (4G) cellular standard, both of which are used today with smartphones and other connected devices. However, efforts to enable faster Wi-Fi networks and the creation of a Fifth Generation (5G) wireless standard are ongoing. Next-generation 5G wireless networks and new Wi-Fi networks, for example, are expected to offer significantly higher bandwidths, lower latencies, and access to additional electromagnetic spectrum. Taken together, this means that exciting new wireless services can be provided to users, such as driverless vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smart phones will be deployed, which is sometimes called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. Further, to enable next-generation wireless technologies, 5G wireless devices and new Wi-Fi devices will be communicating with signals that use wider frequency ranges and that span bands located at higher frequencies of the electromagnetic spectrum as compared to those devices that operate in accordance with older wireless standards. For example, newer devices will be expected to operate at millimeter wave (mmW) frequencies (e.g., frequencies between at least 30 and 300 Gigahertz (GHz), but also including frequencies as low as 4-6 GHz).

To accommodate these commercial expectations and surmount the associated technical hurdles, the components that enable wireless communications under these constraints will be expected to operate efficiently at mmW frequencies. One component that facilitates electronic communication is the wireless interface device, which can include a wireless transceiver and a radio-frequency front-end (RFFE). Unfortunately, the wireless interface devices designed for electronic devices that operate in accordance with the Wi-Fi and 4G cellular standards of today are not adequate for the 5G-capable and faster-Wi-Fi devices of tomorrow, which devices will confront higher frequencies, more-stringent technical demands, and tighter fiscal constraints.

Consequently, to facilitate the adoption of 5G cellular and faster Wi-Fi technologies, as well as the widespread deployment of wireless interface devices that can provide new capabilities and services, existing wireless interface devices will be replaced with those having designs that can handle mmW frequencies. Electrical engineers and other designers of electronic devices are therefore striving to develop new wireless interface devices that will enable the promise of 5G and other higher-frequency technologies to become a reality.

SUMMARY

The developing wireless standards for cellular 5G and newer Wi-Fi networks are intended to establish broadband capabilities at higher frequencies in the gigahertz (GHz) range, including those with corresponding millimeter-sized wavelengths (e.g., mmW frequencies). To enable wireless communications with mmW frequencies, some electronic devices will use signal beamforming Beamforming entails employing an antenna array to direct a signal beam. Aiming a signal beam from an origin apparatus to a destination apparatus can decrease required transmit power and enable a signal to be received at a greater distance as compared to an omnidirectional transmission, including with transmission at mmW frequencies. To generate a signal beam, multiple antenna elements of an antenna array transmit or receive different portions or versions of a communication signal. In some architectures, there is a component chain associated with each antenna element of an antenna array. Individual components of each component chain are therefore reproduced for each antenna element, which can number six, eight, twelve, or more in a single electronic device. Consequently, a negative effect caused by each individual component, such as an amount of energy used by an individual component, may be multiplied by the quantity of antenna elements included in the electronic device.

An example of an individual component that may be included in each component chain is a mixer. The mixer enables a signal being transmitted or received to be upconverted or down-converted, respectively, to a higher or lower frequency. Mixers consume an appreciable amount of power to provide good linearity for the signal up-conversion or down-conversion operations. Depending on simultaneous usage levels, this mixer power consumption can be multiplied by the quantity of antenna elements that are present across multiple antenna arrays that are deployed for beamforming operations. Unfortunately, if mixer power consumption is reduced, the linearity performance of the mixer decreases, which adversely affects the performance of an overall transceiver.

To account for this tradeoff between power consumption and mixer linearity performance, example implementations that are described herein selectively switch modes with different configurations of a multi-mode mixer at different times. The modes can correspond to a higher performance state and a lower power-consumption state. For the higher performance state, with/potentially higher power consumption, the multi-mode mixer is operated in an active mode in which a direct-current (DC) current flows through the multi-mode mixer, including through a mixer core that performs frequency translation between input and output signals. For the lower power-consumption state, the multi-mode mixer is operated in a passive mode in which DC current does not flow through the multi-mode mixer, including by being "blocked" from flowing through the mixer core. To enable or disable current flow, a mixer controller respectively closes or opens a current control switch of the multi-mode mixer. The mixer controller can close the current control switch to establish the active mode for higher performance scenarios, such as if user data is being communicated. On the other hand, the mixer controller can open the current control switch to establish the passive mode for lower performance scenarios, such as non-mission mode use cases. In these manners, a multi-mode mixer can selectively provide good linearity performance for mission-related operational scenarios and can reduce power consumption for non-mission-related operational scenarios.

In an example aspect, an apparatus for mixing signals is disclosed. The apparatus includes a multi-mode mixer. The multi-mode mixer includes a supply voltage node, a ground node, a first data signal coupler, and a second data signal coupler. The multi-mode mixer also includes a mixer core and a current control switch. The mixer core is coupled between the first data signal coupler and the second data signal coupler. The current control switch is configured to selectively enable or disable flow of a current through the mixer core. The first data signal coupler, the second data signal coupler, the mixer core, and the current control switch are coupled together in series between the supply voltage node and the ground node.

In an example aspect, a system for mixing signals is disclosed. The system includes a multi-mode mixer. The multi-mode mixer includes a power distribution network, a first data signal coupler, and a second data signal coupler. The multi-mode mixer also includes a mixer core coupled in series with the first data signal coupler and the second data signal coupler. The multi-mode mixer further includes switch means for controlling current flow through the mixer core using the power distribution network, with the switch means coupled between the mixer core and at least a portion of the power distribution network.

In an example aspect, a method for mixing signals for frequency translation is disclosed. The method includes closing a current control switch coupled between a power distribution network and a mixer core to enable flow of a current through the mixer core. The method also includes performing frequency translation on at least one signal using the mixer core responsive to the closing. The method additionally includes opening the current control switch coupled between the power distribution network and the mixer core to disable flow of the current through the mixer core. The method further includes performing frequency translation on at least one other signal using the mixer core responsive to the opening.

In an example aspect, an apparatus for signal mixing is disclosed. The apparatus includes a wireless interface device. The wireless interface device includes a local oscillator signal generator configured to generate a local oscillator signal and a multi-mode mixer. The multi-mode mixer includes a series path coupled to a power distribution network and a first transistor coupled along the series path. The multi-mode mixer also includes a first data signal coupler coupled along the series path and a second data signal coupler coupled along the series path. The multi-mode mixer further includes a second transistor having a gate terminal, a first channel terminal, and a second channel terminal, with the gate terminal coupled to the local oscillator signal generator. The first channel terminal is coupled to the first data signal coupler, and the second channel terminal is coupled to the second data signal coupler.

BRIEF DESCRIPTION OF DRAWINGS

FIG. 3-1 illustrates the example frequency translation architecture of FIG. 3 in a nonoperational state.

FIG. 3-2 illustrates the example frequency translation architecture of FIG. 3 in a passive mode of an operational state.

FIG. 3-3 illustrates the example frequency translation architecture of FIG. 3 in an active mode of the operational state.

FIG. 4-1 illustrates an example frequency translation architecture with single-ended circuitry and a current control switch coupled nearer a power supply node.

FIG. 4-2 illustrates another example frequency translation architecture with single-ended circuitry and a current control switch coupled nearer a ground node.

FIG. 5-1 illustrates an example frequency translation architecture with differential circuitry and a current control switch coupled nearer a power supply node.

FIG. 5-2 illustrates another example frequency translation architecture with differential circuitry and a current control switch coupled nearer a ground node.

DETAILED DESCRIPTION

Figure 1:
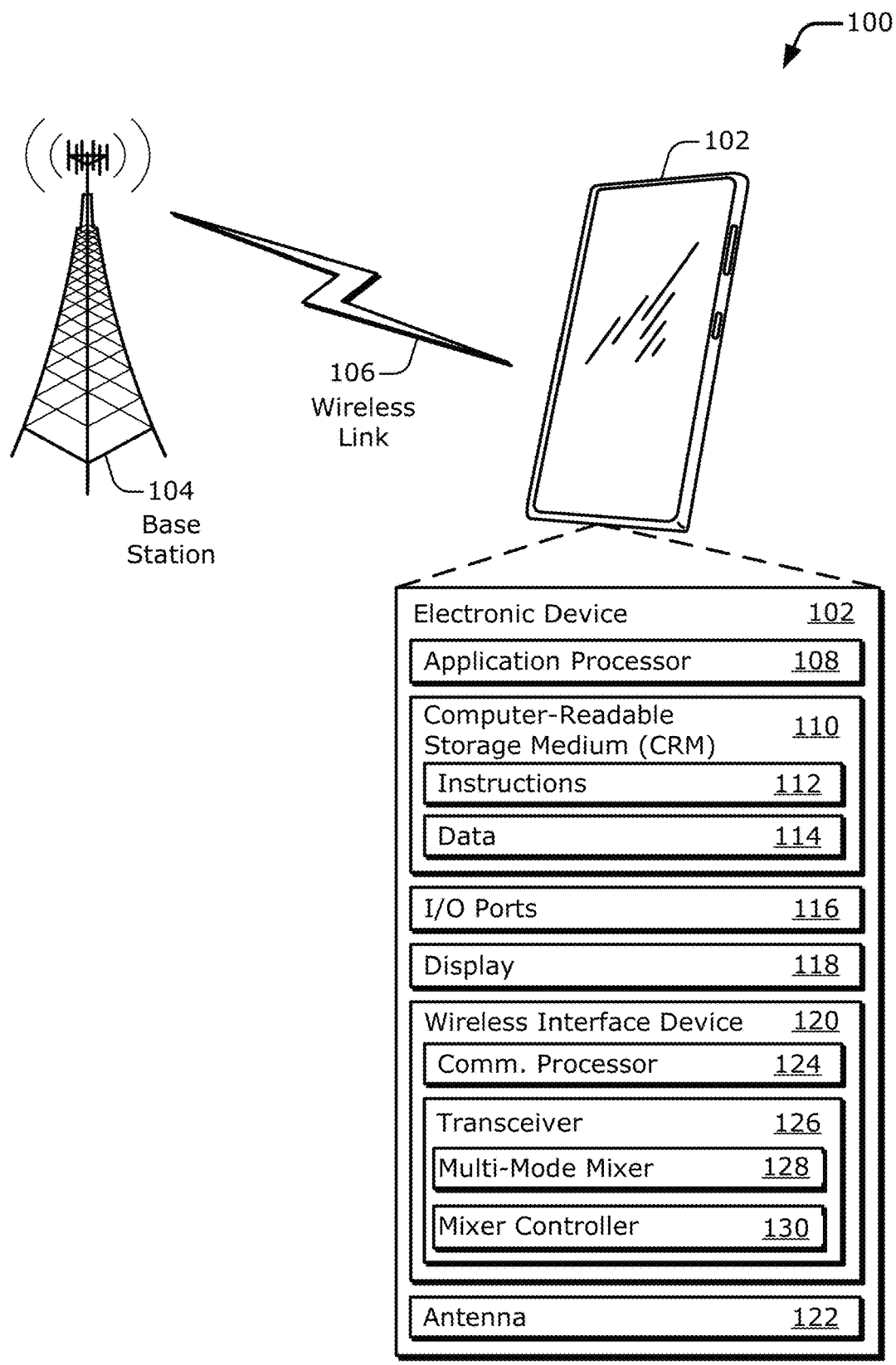
FIG. 1 illustrates an example environment that includes an electronic device with a wireless interface device having a multi-mode mixer with an associated mixer controller that can switch the multi-mode mixer between active and passive modes.

As compared to 4G cellular and existing Wi-Fi networks, next-generation 5G cellular and newer Wi-Fi networks will utilize higher electromagnetic (EM) frequencies, such as millimeter wave (mmW) frequencies that can span approximately 3 to 300 Gigahertz (GHz) of the EM spectrum. Although higher frequencies can offer higher bandwidth and lower latency, higher frequencies also create problems. For example, signals transmitted at higher frequencies are attenuated by the atmosphere more quickly and therefore have shorter intrinsic ranges at a given power level. To account for the naturally-shorter transmission distances, signals can be transmitted in signal beams that direct a signal toward a particular target with more effective power, which is called antenna beamforming Using beamforming, a transmission at a given power level can travel farther as a signal beam as compared to being transmitted omnidirectionally.

Thus, 5G and faster Wi-Fi electronic devices may utilize beamforming to direct signals toward receiving devices. A wireless interface device of an electronic device is at least partially responsible for generating signal beams. To form a signal beam, a wireless interface device uses an antenna array to emanate multiple versions of a transmission signal in which the versions are modified with respect to each other. The modifications of the different signal versions can include being amplified by different amounts or being delayed by different time durations, or phase shifted with respect to each other. Receiving a communication signal with beamforming techniques works in a reverse manner.

To modify different signal versions corresponding to respective ones of different antenna elements of an antenna array, a wireless interface device that is coupled to the antenna array may include a respective component chain of multiple component chains for each respective antenna element of multiple antenna elements. An electronic device may include multiple antenna arrays that each have multiple antenna elements. In some architectures, there is a component chain associated with each antenna element of an antenna array. If, for instance, an electronic device includes three antenna arrays each having four antenna elements, the electronic device may include a dozen total antenna elements and therefore a dozen corresponding component chains. Individual components of each component chain are thus reproduced for each antenna element, which can number 6, 8, 12, 16, or more in a single electronic device. Consequently, an impact by each individual component, such as the energy used by the individual component, may be multiplied by the total quantity of antenna elements of the electronic device, or at least by the quantity of antenna elements simultaneously or contemporaneously involved in beamforming operations.

An example of an individual component that may be included in each component chain is a mixer. A mixer enables a signal being transmitted or received to be up-converted or down-converted, respectively, to a higher or lower frequency. Mixers consume an appreciable amount of power to provide good linearity for the signal up-conversion or down-conversion. Depending on a degree of simultaneous antenna array utilization, this mixer power consumption can be multiplied by the quantity of antenna elements that are present across multiple antenna arrays that are employed for beamforming operations. Unfortunately, if mixer power consumption is reduced, the linearity performance of the mixer decreases, which adversely affects a performance level of an overall transceiver.

To account for this tradeoff between power consumption and mixer linearity performance, example implementations that are described herein selectively switch operational modes of a multi-mode mixer to operate in a different mode at different times. The operational modes correspond to a higher power-consumption state and a lower power-consumption state. For the higher power-consumption state, which provides higher performance, the multi-mode mixer is operated in an active mode in which a direct-current (DC) current is enabled to flow through the multi-mode mixer, including through a mixer core that performs frequency translation between input and output signals. For the lower power-consumption state, the multi-mode mixer is operated in a passive mode in which the DC current is not permitted to flow through the multi-mode mixer, including by being "blocked" from flowing through the mixer core.

The multi-mode mixer includes, in addition to a mixer core, a current control switch that is coupled to a power distribution network. To enable or disable current flow, a mixer controller respectively closes or opens the current control switch of the multi-mode mixer. The mixer controller can close the current control switch to enable current flow through the mixer core to establish the active mode for higher performance scenarios, such as if user data is being communicated. On the other hand, the mixer controller can open the current control switch to block current flow through the mixer core to establish the passive mode for lower performance scenarios, such as non-mission mode use cases. Examples of non-mission mode use cases include waking-up the receiver, employing a lower-throughput modulation scheme such as Quadrature Phase Shift Keying (QPSK), and so forth. In these manners, a multi-mode mixer can selectively provide good linearity performance for mission-related operational scenarios and can reduce power consumption for non-mission-related operational scenarios, thereby efficiently balancing the tension between linearity performance and power consumption.

FIG. 1 illustrates an example environment 100 that includes an electronic device 102 with a wireless interface device 120 having a multi-mode mixer 128 and an associated mixer controller 130 that can switch the multi-mode mixer 128 from an active mixer to a passive mixer, and vice-versa. In the environment 100, the example electronic device 102 communicates with a base station 104 through a wireless link 106. As shown, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smart watch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device generally as described above, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project Long-Term Evolution (3GPP LTE) standard, such as a Fourth Generation (4G) or a Fifth Generation (5G) cellular standard; an IEEE 802.11 standard, such as 802.11ac, ax, ad, aj, or ay; an IEEE 802.16 standard; a Bluetooth™ standard; and so forth. In some implementations, the wireless link 106 may wirelessly provide power, and the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a display screen or a projection that presents graphical images provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 also includes at least one wireless interface device 120 and at least one antenna 122, which are coupled one to the other. The wireless interface device 120 provides connectivity to respective networks and peer devices via a wireless link, which may be configured similar to or differently from the wireless link 106. Alternatively or additionally, the electronic device 102 may include a wired interface device (not explicitly shown), such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. However, the electronic device 102 may also communicate directly with other peer devices, an alternative wireless network, and the like.

As shown, the wireless interface device 120 includes at least one communication processor 124 (Comm Processor 124) and at least one transceiver 126. The transceiver 126 includes at least one multi-mode mixer 128 and at least one mixer controller 130. These components process data information, control information, and signals associated with communicating information for the electronic device 102 over the antenna 122. The communication processor 124 may be implemented as a system-on-chip (SoC), a modem baseband processor, a baseband radio processor (BBP), and so forth that enables a digital communication interface for data, voice, messaging, or other applications of the electronic device 102. In some cases, the application processor 108 and the communication processor 124 can be combined into one module or integrated circuit (IC), such as an SoC. Regardless, the application processor 108 or the communication processor 124 can be operably coupled to one or more other components, such as the CRM 110 or the display 118, to enable control of, or other interaction with, the other components of the electronic device 102.

The communication processor 124 can include a digital signal processor (DSP) or one or more signal-processing blocks (not shown) for encoding and modulating data for transmission and for demodulating and decoding received data. Additionally, the communication processor 124 may also include a memory (not explicitly shown) to store data and processor-executable instructions (e.g., code), such as a CRM 110. Furthermore, the communication processor 124 may also manage (e.g., control or configure) aspects or operation of the transceiver 126, the multi-mode mixer 128, the mixer controller 130, and other components of the wireless interface device 120 to implement various communication protocols or communication techniques. Although not explicitly shown, the wireless interface device 120 can also include a digital-to-analog converter (DAC) or an analog-to-digital converter (ADC) to convert between analog signals and digital signals. The DAC and the ADC can be implemented as part of the communication processor 124, as part of the transceiver 126, or separately from both of them.

The transceiver 126 includes circuitry and logic for filtering, amplification, channelization, frequency translation, and so forth. The frequency translation may include an up-conversion or a down-conversion of frequency that is performed in a single conversion operation, or through multiple conversion operations, using at least one mixer, such as the multi-mode mixer 128. Thus, the transceiver 126 can include filters, switches, amplifiers, mixers, and so forth for routing and conditioning signals that are transmitted or received via the antenna 122. The components or circuitry of the transceiver 126 can be implemented in any suitable fashion, such as combined transceiver logic or separately as respective receiver and transceiver entities. In some cases, the transceiver 126 is implemented with multiple or different sections to implement respective receiving and transmitting operations (e.g., separate transmit and receive chains). The transceiver 126 may also include logic to perform in-phase/quadrature (I/Q) operations, such as synthesis, phase correction, phase shifting, modulation, demodulation, and the like.

In example implementations, the multi-mode mixer 128 can facilitate a frequency up-conversion or frequency down-conversion operation while in an active mode or a passive mode. As compared to the active mode that offers a relatively higher level of performance, less current flows while the multi-mode mixer 128 is operating in the passive mode. Thus, power consumption can be reduced by operating the multi-mode mixer 128 in the passive mode, even with some decreased linearity performance. The multi-mode mixer 128 can therefore be operated in different modes to balance linearity performance versus power consumption to improve efficient energy usage. In operation, the mixer controller 130 causes the multi-mode mixer 128 to switch operation between two or more modes, such as the passive mode or the active mode, depending on one or more factors as described herein. An example transceiver architecture that incorporates the multi-mode mixer 128 and the mixer controller 130 is described with reference to FIG. 2. An example multi-mode mixer 128 is described further below with reference to FIG. 3 in the context of an example frequency translation architecture.

Figure 2:
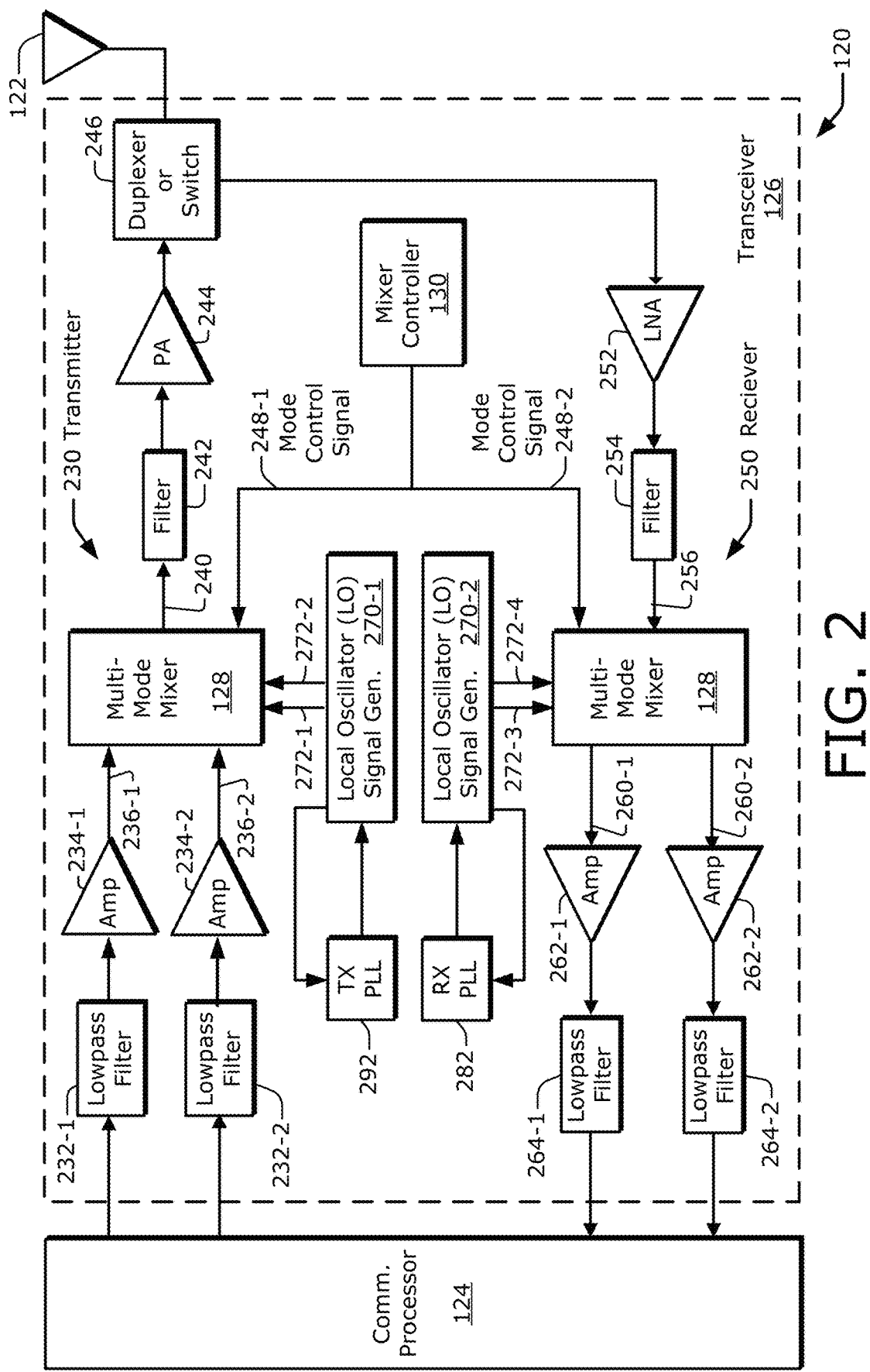
FIG. 2 illustrates an example architecture of a wireless interface device including a transceiver with a multi-mode mixer and associated mixer controller.

FIG. 2 illustrates a block diagram of an example architecture of a wireless interface device 120 in which aspects of the present disclosure may be implemented. In this example, the wireless interface device 120 includes a communication processor 124 and a transceiver 126. The transceiver 126 includes a transmitter 230 and a receiver 250 that jointly support bi-directional communication. In general, the wireless interface device 120 may include any quantity of transmitters and any quantity of receivers for any number of communication systems or frequency bands. All or a portion of the transceiver 126 may be implemented on one or more analog integrated circuits (ICs), radio frequency integrated circuits (RFICs), mixed-signal ICs, and so forth. The term "transceiver" is used herein to functionally describe some elements of the wireless interface device 120. Some of the elements illustrated in the transceiver 126 may be included in a transceiver chip, module, or circuit, while other elements of the transceiver 126 may be implemented separately in a radio frequency front end (RFFE), as discrete components, in a separate module, and so forth.

The transmitter 230 or the receiver 250 may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband frequency in another stage. Here, there can be one or multiple IF conversion stages between RF and baseband frequency. In contrast, with the direct-conversion architecture, which is also referred to as zero-IF (ZIF or OZIF), a signal is frequency converted between RF and baseband frequency in one (1) stage. The super-heterodyne and direct-conversion architectures may use different circuit blocks or have different technical specifications. In FIG. 2, the transmitter 230 and the receiver 250 are implemented with a direct-conversion architecture by way of example. However, the components described with reference to FIG. 2 are generally applicable to super-heterodyne architectures. Thus, the principles described herein for a multi-mode mixer 128 are applicable to both direct-conversion and super-heterodyne architectures.

As shown, a phase locked loop (PLL) and a local oscillator (LO) are used with the transmitter 230 and the receiver 250. A transmit phase locked loop 292 (TX PLL 292) and an associated local oscillator signal generator 270-1 (LO Signal Gen. 270-1) generate I and Q LO signals 272-1 and 272-2, respectively. These TX LO signals are used for frequency up-conversion in the transmitter 230. A receive phase locked loop 282 (RX PLL 282) and an associated local oscillator signal generator 270-2 (LO Signal Gen. 270-2) generate I and Q LO signals 272-3 and 272-4, respectively. These RX LO signals are used for frequency down-conversion in the receiver 250. Each LO signal 272 can be realized, for example, as a periodic signal with a particular fundamental frequency. In operation, the TX PLL 292 receives timing information from the communication processor 124 and generates a control signal used to adjust a frequency or a phase of the TX LO signals 272-1 and 272-2 generated by the associated LO signal generator 270-1. Similarly, the RX PLL 282 receives timing information from the communication processor 124 and generates a control signal used to adjust a frequency or a phase of the RX LO signals 272-3 and 272-4 generated by the associated LO signal generator 270-2.

In the transmit path, the communication processor 124 processes data to be transmitted and provides I and Q analog output signals to the transmitter 230. The communication processor 124 includes digital-to-analog converters (DACs) (not shown) for converting signals generated by the communication processor 124 into the I and Q analog output signals, e.g., into I and Q output currents, for further processing by the transmitter 230. Within the transmitter 230, lowpass filters 232-1 and 232-2 filter the I and Q analog output signals, respectively, to remove undesired signal images caused by the prior DACs. Amplifiers 234-1 and 234-2 (Amp 234-1 and Amp 234-2) amplify the analog signals accepted from the lowpass filters 232-1 and 232-2, respectively, and provide I and Q baseband signals 236-1 and 236-2, respectively. A multi-mode mixer 128 in the transmit path up-converts the I and Q baseband signals 236-1 and 236-2 using the I and Q LO signals 272-1 and 272-2 generated responsive to a reference signal provided by the TX PLL 292. Based on the I and Q LO signals 272-1 and 272-2 generated by the LO signal generator 270-1 and using a frequency up-conversion operation, the multi-mode mixer 128 produces an up-converted signal 240. The multi-mode mixer 128 in the transmit path of the transceiver may up-convert the signal in a passive mode or in an active mode depending on the associated purpose or mission mode of the transmission as described herein.

In some cases, there can be a tradeoff between the consumed power and the quality of the up-converted signal. For certain non-critical operations (e.g., certain "sleep mode" operations), it may be desirable to up-convert the signal in a passive mode to likely save power. The mixer controller 130 selects the active mode or the passive mode of the multi-mode mixer 128 through a mode control signal 248-1 in the transmit path. A filter 242 filters the up-converted signal 240 to remove images caused by the frequency up-conversion and to remove noise in a transmit frequency band. A power amplifier 244 (PA 244) amplifies the filtered signal accepted from the filter 242 to attain a desired output power level and provides a transmit RF signal. The transmit RF signal is routed through a duplexer or switch 246 and transmitted over an antenna 122.

In the receive path, the antenna 122 receives signals transmitted by the base station 104, other wireless communication devices, and the like. The antenna 122 provides a received RF signal, which is routed through the duplexer or switch 246 and provided to a low noise amplifier 252 (LNA 252) of the receiver 250. The received RF signal is amplified by the LNA 252 and filtered by a filter 254 to obtain an RF input signal 256. The filter 254 provides the RF input signal 256 to a multi-mode mixer 128 in the receive path. The multi-mode mixer 128 in the receive path down-converts a frequency of I and Q versions of the RF input signal 256 to produce down-converted I and Q baseband signals 260-1 and 260-2. The multi-mode mixer 128 uses the I and Q LO signals 272-3 and 272-4 from the LO signal generator 270-2 (LO Signal Gen. 270-2) to produce the down-converted I and Q baseband signals 260-1 and 260-2. The mixer controller 130 selects the active mode or the passive mode of the multi-mode mixer 128 through a mode control signal 248-2 in the receive path. In FIG. 2, the mixer controller 130 controls two multi-mode mixers. However, a single mixer controller 130 may control more multi-mode mixers or be dedicated to controlling a single multi-mode mixer. The I and Q baseband signals 260-1 and 260-2 are amplified by respective amplifiers 262-1 and 262-2 and further filtered by respective lowpass filters 264-1 and 264-2 to obtain I and Q analog input signals, which are provided to the communication processor 124. The communication processor 124 includes analog-to-digital converters (ADCs) (not shown) for converting the analog input signals into digital signals to be further processed by the communication processor 124.

Each antenna 122 may be realized as an antenna array having multiple antenna elements or as an antenna element that is part of an antenna array. Further, in some implementations, instead of a single antenna 122, multiple antennas are coupled to the transceiver 126. These multiple antennas may be used with shared or separate transceiver chains (concurrently, non-concurrently, or in separate modes), for beamforming, for carrier aggregation, for multiple-input and multiple-output (MIMO) scenarios, for diversity, and so forth. Thus, each of the antennas may be coupled to one or more receive or transmit chains. Generally, each antenna 122 may be coupled to transmit or receive circuitry as described above or in an alternative manner.

Figure 3:
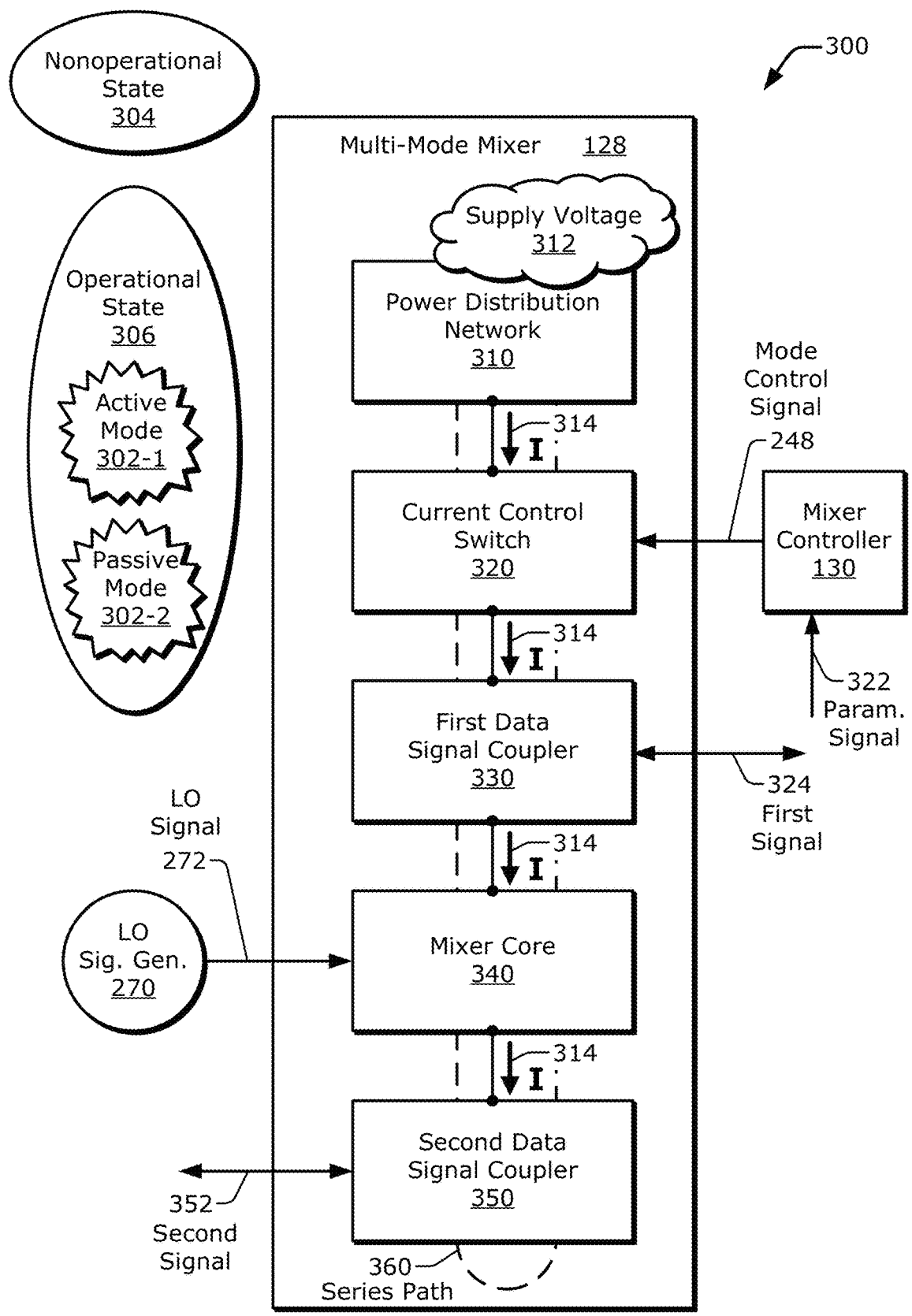
FIG. 3 illustrates an example frequency translation architecture that includes the multi-mode mixer, the mixer controller, and a local oscillator signal generator.
Figures 1, 3:
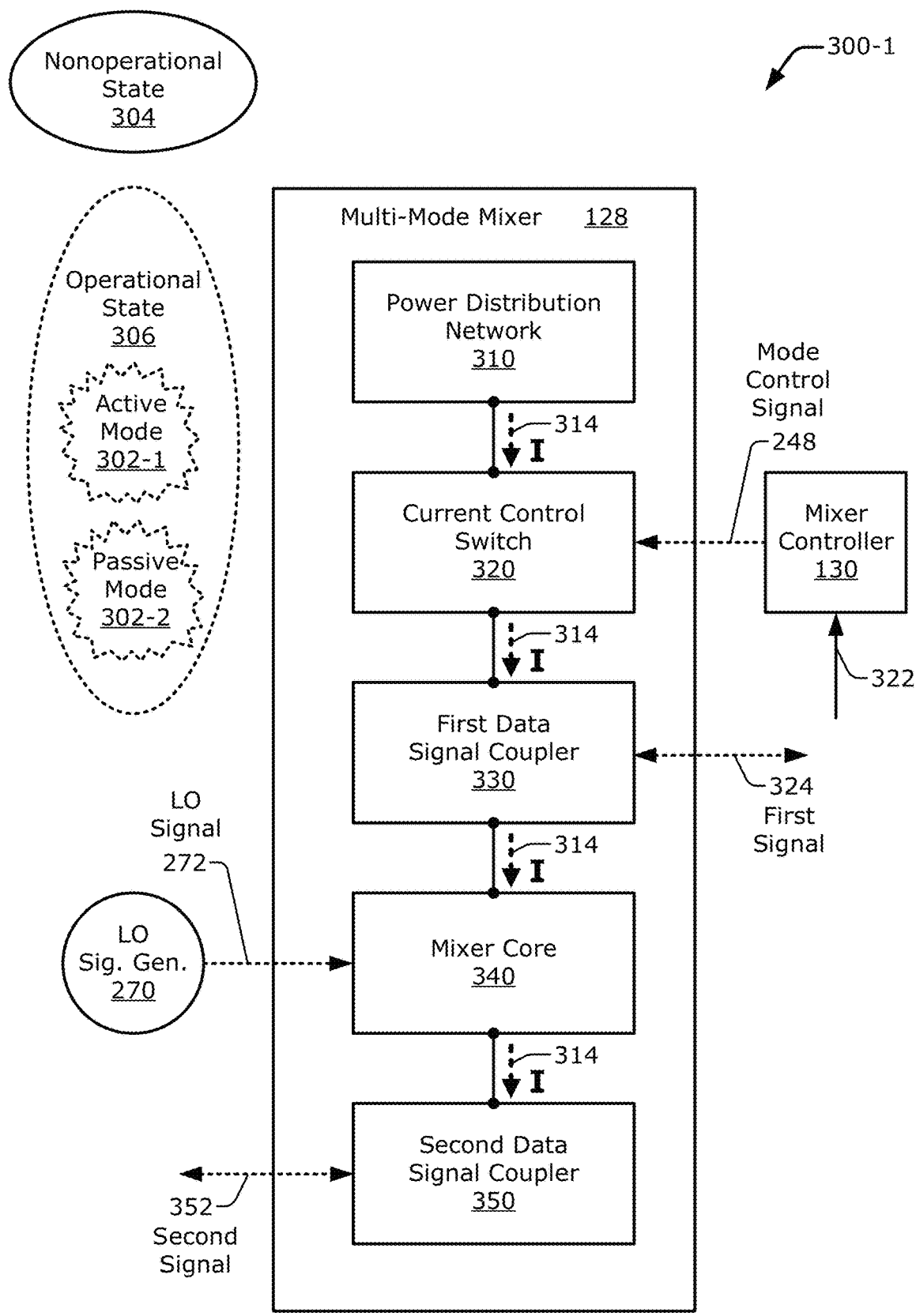
Figures 2, 3:
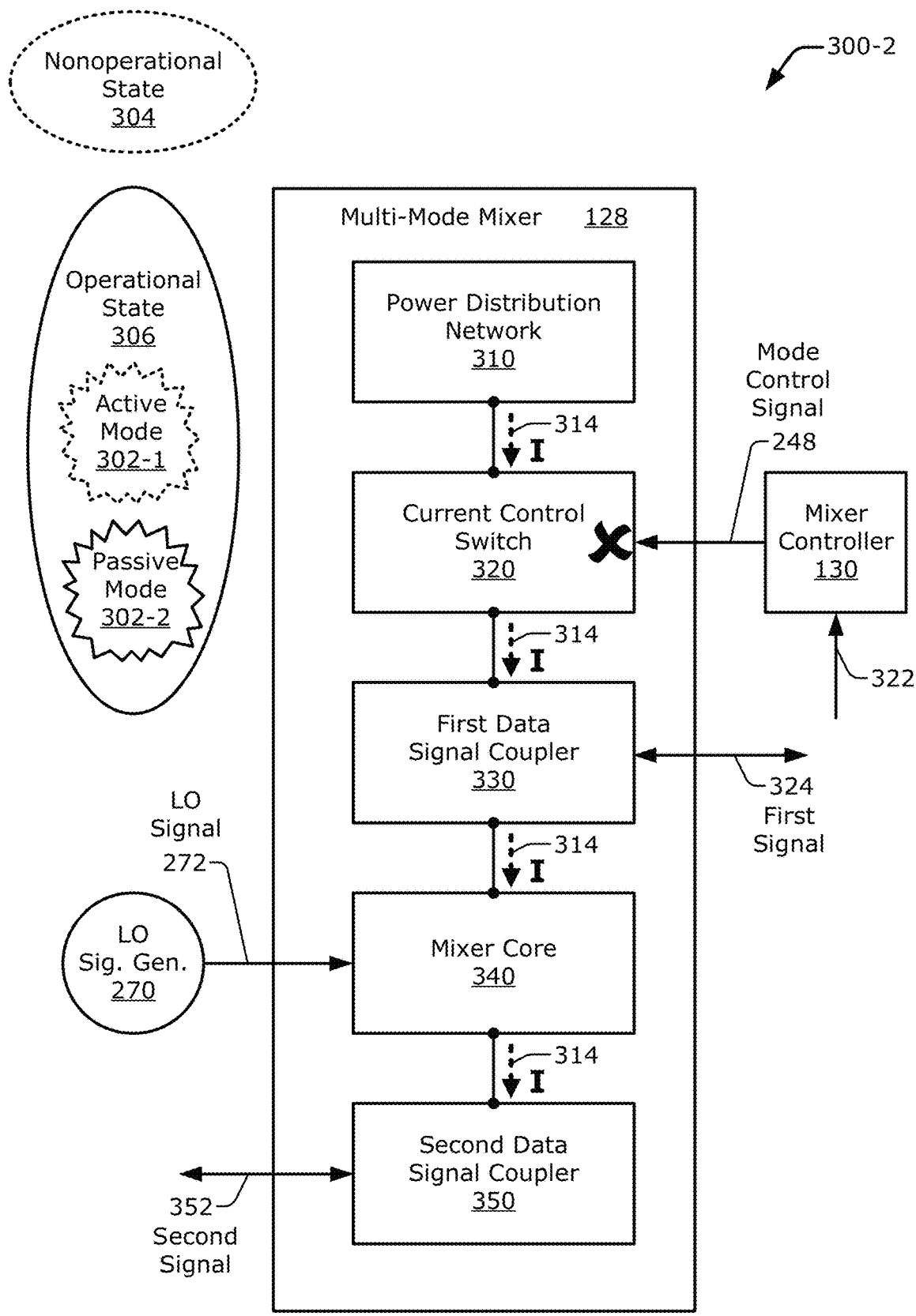
Figure 3:
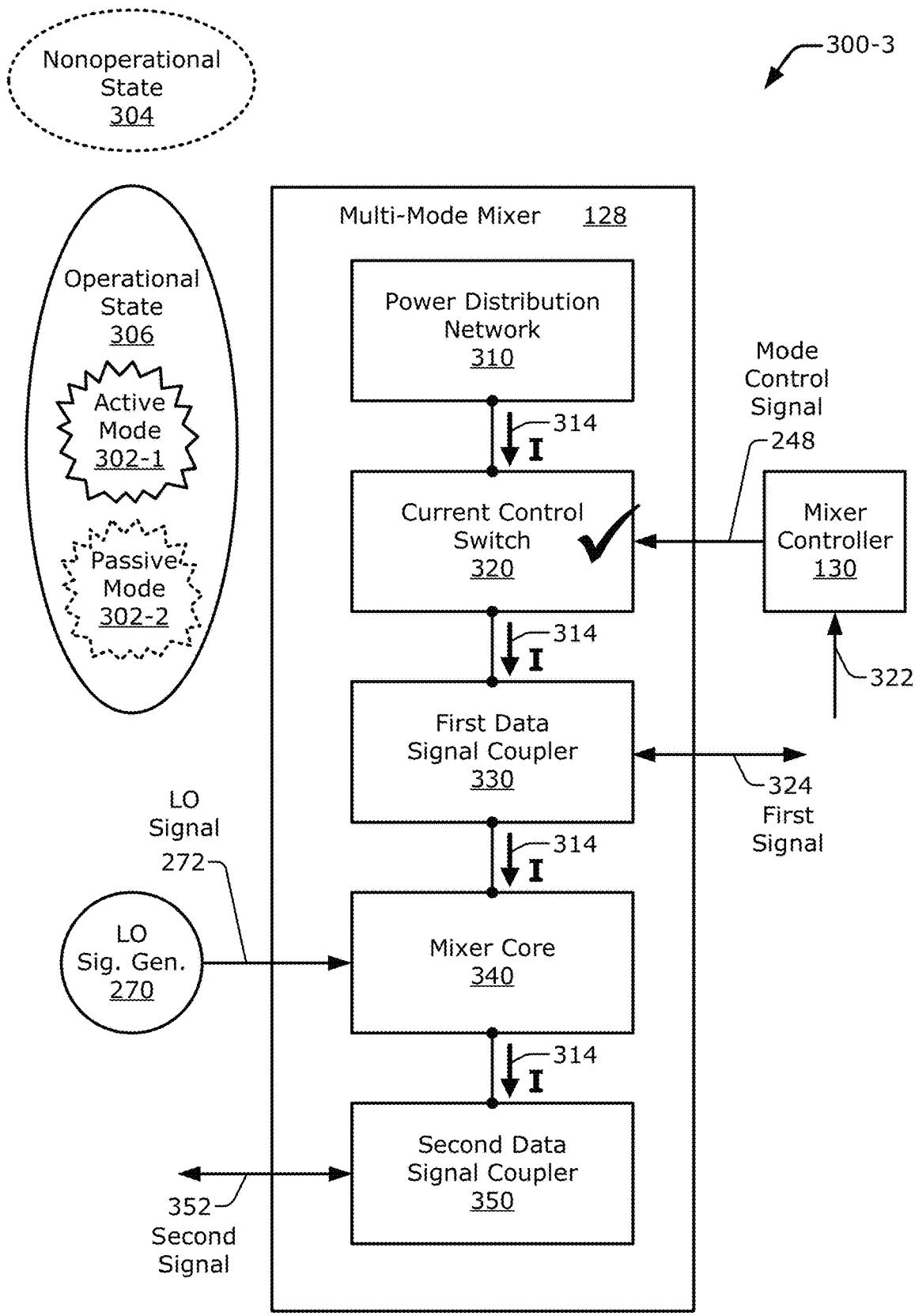

FIG. 3 illustrates an example frequency translation architecture 300 that includes the multi-mode mixer 128, the mixer controller 130, and the LO signal generator 270 (LO Sig. Gen. 270). At least a portion of the frequency translation architecture 300 can be included as part of the transceiver 126 (of FIGS. 1 and 2), such as by being part of the transmitter 230 or the receiver 250. One or more components of the frequency translation architecture 300, such as the mixer controller 130 or the LO signal generator 270, may also be shared across the transmitter 230 and the receiver 250. In example implementations, the multi-mode mixer 128 can be in a nonoperational state 304 or in an operational state 306. While in the operational state 306, the multi-mode mixer 128 can be operated in any of multiple modes 302-1 to 302-2, such as an active mode 302-1 or a passive mode 302-2, by placing the multi-mode mixer 128 in a different respective operational configuration for each respective mode 302 at a different respective time. For instance, if in the operational state 306, the multi-mode mixer 128 can operate in the active mode 302-1 at a first time and in the passive mode 302-2 at a second time. These various states and different modes are described below with reference to FIGS. 3-1 to 3-3.

As shown, the multi-mode mixer 128 can include a portion of a power distribution network 310, a current control switch 320, a first data signal coupler 330, a mixer core 340, and a second data signal coupler 350. However, the multi-mode mixer 128 can include more, fewer, or different components. The power distribution network 310, the current control switch 320, the first data signal coupler 330, the core 340, and the second data signal coupler 350 are coupled together in series along a series path 360 that can carry a current 314 (I 314). Here, the current 314 may comprise a direct-current (DC) current that flows substantially independently of alternating-current (AC) versions of a first signal 324, a second signal 352, and the LO signal 272. Thus, the current control switch 320 can control whether the current 314 flows through one or more of the other components, such as the mixer core 340. Generally, the active mode 302-1 corresponds to the current 314 being enabled to flow through the mixer core 340 at one time, and the passive mode 302-2 corresponds to the current 314 being disabled from flowing through the mixer core 340 at another time.

The mixer controller 130 is coupled to the current control switch 320 to control a state (e.g., an open state or a closed state) of the current control switch 320. The LO signal generator 270 is coupled to the mixer core 340. The first data signal coupler 330 couples (e.g., accepts or provides) the first signal 324 from or to an adjacent component of a component chain (not shown in FIG. 3) in an upstream or a downstream direction. The second data signal coupler 350 couples the second signal 352 from or to an adjacent component of a component chain (not shown in FIG. 3) in a downstream or an upstream direction. Depending on implementation or current operation, the first signal 324 can comprise an input signal while the second signal 352 comprises an output signal, or the second signal 352 can comprise an input signal while the first signal 324 comprises an output signal.

Generally, in the nonoperational state 304, the multi-mode mixer 128 is not performing a mixing operation. For example, no active LO signal 272 is being provided to the multi-mode mixer 128, or the first signal 324 or the second signal 352 is not being coupled to the multi-mode mixer 128 (or both). In the operational state 306, on the other hand, a communication signal is propagating through the multi-mode mixer 128 (e.g., a communication signal has a changing voltage level) as the first signal 324 and the second signal 352 on the way to or from an antenna element so that the multi-mode mixer 128 can perform a signal mixing operation. At least during the operational state 306, the power distribution network 310 can provide power to the multi-mode mixer 128 using a power rail (not explicitly shown), which is held at some supply voltage 312, and a ground plane (not explicitly shown). The power rail can include a supply voltage node, and the ground plane can include a ground node, both of which are described herein below.

To establish different modes, the mixer controller 130 controls the current control switch 320 using a mode control signal 248 to select between the active mode 302-1 or the passive mode 302-2 during the operational state 306 of the multi-mode mixer 128. The mixer controller 130, in turn, operates responsive to a parameter signal 322. The parameter signal 322 can indicate, for example, whether lower power or better linearity is to be prioritized during a current communication operation. The communication processor 124, for instance, can provide the parameter signal 322 to the mixer controller 130. In the active mode 302-1, the current control switch 320 enables the current 314 to flow along at least part of the series path 360 and through at least some of the components of the multi-mode mixer 128 as a result of the voltage differential established by the power distribution network 310 (e.g., a voltage differential between a supply voltage node and a ground node). In contrast, in the passive mode 302-2, the current control switch 320 blocks the current 314 from flowing along the series path 360 (e.g., a DC current 314 that is flowing along the series path 360 is negligible or approximately zero). Thus, in the passive mode 302-2, except for some current leakage, the current 314 is not flowing through the components of the multi-mode mixer 128. This reduction in DC current flow is an example of how the frequency translation architecture 300 can lower power consumption in the passive mode 302-2 as compared to the power consumption in the active mode 302-1.

To facilitate a frequency translation operation between an input and an output of the multi-mode mixer 128, the mixer core 340 is disposed between the first data signal coupler 330 and the second data signal coupler 350. In the operational state 306, the mixer core 340 performs a frequency translation operation between the first signal 324 and the second signal 352 (in either direction) based on the LO signal 272. Whether the multi-mode mixer 128 is in the active mode 302-1 or the passive mode 302-2, the first data signal coupler 330 couples the first signal 324 into or out of the multi-mode mixer 128. Similarly, the second data signal coupler 350 couples the second signal 352 into or out of the multi-mode mixer 128. Each data signal coupler couples a signal that is accepted from or is being provide to another component, such as an amplifier or filter, of a component chain. Examples of data signal couplers include one or more inductors, at least one capacitor, a transformer, an RF choke, some combination thereof, and so forth.

Two example forms of frequency translation are frequency up-conversion and frequency down-conversion. Thus, the first signal 324 and the second signal 352 have different frequencies. For example, the first signal 324 can comprise a relatively higher-frequency signal while the second signal 352 comprises a relatively lower-frequency signal. Alternatively, the first signal 324 can comprise a relatively lower-frequency signal while the second signal 352 comprises a relatively higher-frequency signal. The frequency translation can be part of a super-heterodyne architecture that includes at least one IF between RF and baseband frequency. Alternatively, the frequency translation can be part of a direct conversion or zero-IF (ZIF) architecture that does not utilize an IF and instead directly converts between RF and baseband frequency.

The flow of a communication signal through the first and second data signal couplers 330 and 350 and over the mixer core 340 can occur in any direction and can result in frequency up-conversion or down-conversion, depending on the underlying circuit components and their configuration. However, in some implementations, the first signal 324 has a lower frequency than the second signal 352. In these implementations, for an up-conversion operation (e.g., as part of a signal transmission), the first signal 324 is provided to the first data signal coupler 330 from an upstream component, and the first data signal coupler 330 couples the first signal 324 to the mixer core 340. Responsive to the LO signal 272, the mixer core 340 up-converts a frequency of the first signal 324 to produce the second signal 352 and provides the second signal 352 to the second data signal coupler 350. The second data signal coupler 350 accepts the second signal 352 and couples the second signal 352 to a downstream component. For a down-conversion operation (e.g., as part of a signal reception), the second signal 352 is provided to the second data signal coupler 350 from an upstream component, and the second data signal coupler 350 couples the second signal 352 to the mixer core 340. Responsive to the LO signal 272, the mixer core 340 down-converts a frequency of the second signal 352 to produce the first signal 324 and provides the first signal 324 to the first data signal coupler 330. The first data signal coupler 330 accepts the first signal 324 from the mixer core 340 and couples the first signal 324 to a downstream component.

To further illuminate the principles of the frequency translation architecture 300, operation thereof is described with reference to certain parts of FIG. 2 by way of example only. In these examples, the first signal 324 is considered an input signal, and the second signal 352 is considered an output signal. In some implementations, such as those corresponding to a transceiver 126 as depicted in FIG. 2, the first signal 324 corresponds to an I baseband signal component 236-1 or a Q baseband signal component 236-2 in the transmit path and corresponds to the RF filtered signal 256 in the receive path. In general, a first or second data signal coupler 330 or 350 can split, combine, or pass with substantially no change those signals that propagate through the coupler along the transmit or receive paths on the way to or from a mixer core 340. In the receive path, the first data signal coupler 330 can split the RF filtered signal 256 into I and Q components (not shown) prior to entering the mixer core 340. In the transmit path, the first data signal coupler 330 can pass the I and Q baseband signal components 236-1 and 236-2 such that these signal components enter the mixer core 340. Thus, the signals in the transmit path and the receive path are already separated into I and Q components as the signals enter the mixer core 340. Alternatively, a multi-mode mixer 128 can implement a separate mixer core 340 for each respective I and Q signal component.

The mixer core 340 of the multi-mode mixer 128 in the transmitter 230 up-converts the first signal 324, which corresponds to the I and Q baseband signal components 236-1 and 236-2 in the transmit path. The mixer core 340 uses the I and Q LO signals 272-1 and 272-2 for frequency up-conversion, which LO signals are generated by the LO signal generator 270-1. Thus, the mixer core 340 produces an up-converted second signal 352, which corresponds to the up-converted signal 240. In the transmit path, the second data signal coupler 350 couples the I and Q components (not shown in FIG. 3) to provide the second signal 352 to a downstream component. Here, the second signal 352 can correspond to an I component, a Q component, or a combined up-converted signal 240 in the transmit path.

In contrast, the mixer core 340 of the multi-mode mixer 128 in the receiver 250 down-converts the first signal 324, which represents the I and Q signal components (not shown) of the filtered signal 256 in the receive path. The mixer core 340 uses the I and Q LO signals 272-3 and 272-4 for frequency down-conversion, which signals are generated by the LO signal generator 270-2. Thus, the mixer core 340 produces a down-converted second signal 352, which corresponds to the down-converted I and Q baseband signals 260-1 and 260-2. In the receive path, the second data signal coupler 350 passes the down-converted I and Q components (not shown in FIG. 3) of the second signal 352 to a downstream component in the receive path, such as a buffer or amplifier.

FIG. 3-1 illustrates the example frequency translation architecture of FIG. 3 in a nonoperational state 304 at 300-1. Accordingly, the indicator of the nonoperational state 304 is depicted with a solid line, and the indicator of the operational state 306 is depicted with a dashed line. Moreover, inapplicable or inactive signals are generally depicted with dashed lines in FIGS. 3-1 to 3-3. In the nonoperational state 304, the multi-mode mixer 128 is not engaged for frequency translation. Thus, at least one of the first signal 324, the second signal 352, or the LO signal 272 is inactive as represented in FIG. 3-1 by dashed lines. Here, an inactive signal corresponds to a signal having a voltage level that is substantially constant, unchanging, zero, or some combination thereof. For example, these signals can be gated from the multi-mode mixer 128 or permitted to drift to ground or driven to a supply voltage level. In some cases, in the nonoperational state 304, the current 314 is blocked from flowing by the current control switch 320. In these cases, the mixer controller 130 generates the mode control signal 248 to cause the current control switch 320 to be in an open state. Further, the multi-mode mixer 128 can be disconnected from the power distribution network 310 during the nonoperational state 304 to save power. The power disconnection can occur at the mixer level or at a block or core level that includes the multi-mode mixer 128, such as if a transmit or receive chain is powered down while not being used.

FIG. 3-2 illustrates the example frequency translation architecture of FIG. 3 in a passive mode 302-2 of an operational state 306 at 300-2. In the operational state 306, the multi-mode mixer 128 receives power via the power distribution network 310. Further, the multi-mode mixer 128 is engaged and performing frequency translation operations in the operational state 306. Thus, at least one of the first signal 324, the second signal 352, or the LO signal 272 is active as represented in FIG. 3-2 by solid lines. Here, an active signal corresponds to a signal having a voltage level that is changing over time. For example, the LO signal 272 is oscillating at some LO frequency to provide a frequency-translating signal to convert to or from an IF, an RF, or a baseband frequency. The mixer core 340 is also being biased into an operational range. More specifically, the multi-mode mixer 128 can apply a bias voltage to a gate terminal of each transistor of the mixer core 340 to operate in the active mode 302-1 and to operate in the passive mode 302-2.

The first signal 324 and the second signal 352 are modulated in accordance with some data to be communicated while in the operational state 306. For the passive mode 302-2 of the operational state 306, the current 314 is blocked from flowing by the current control switch 320. In the passive mode 302-2, the mixer controller 130 generates the mode control signal 248 to cause the current control switch 320 to be in an open state, which blocks DC current flow as represented by the "X" mark on the current control switch 320. The absence of flow by the DC current 314 is also represented in FIG. 3-2 by the dashed lines for the current 314 (I 314). By preventing DC current flow, the multi-mode mixer 128 consumes less power in the passive mode 302-2 than in the active mode 302-1. The passive mode 302-2 can be used, for example, with non-mission-mode activities, such as temporarily awakening a transceiver, and lower-bandwidth modulation schemes.

FIG. 3-3 illustrates the example frequency translation architecture of FIG. 3 in an active mode 302-1 of the operational state 306 at 300-3. In the operational state 306, the multi-mode mixer 128 receives power via the power distribution network 310. Further, the multi-mode mixer 128 is engaged and performing frequency translation operations in the operational state 306. Thus, at least one of the first signal 324, the second signal 352, or the LO signal 272 is active as represented in FIG. 3-3 by solid lines. Here, an active signal corresponds to a signal having a voltage level that is changing over time, as described above. The mixer core 340 is also being biased into an operational range. For the active mode 302-1 of the operational state 306, the current 314 is permitted to flow by the current control switch 320. In the active mode 302-1, the mixer controller 130 generates the mode control signal 248 to cause the current control switch 320 to be in a closed state, which enables DC current flow as represented by the "check" mark on the current control switch 320. The existence of flow by the DC current 314 is also represented in FIG. 3-3 by the solid lines for the current 314 (I 314). By enabling DC current flow, the multi-mode mixer 128 consumes more power in the active mode 302-1 than in the passive mode 302-2. However, performance, such as gain and linearity, is superior in the active mode 302-1 as compared to the passive mode 302-2 for some operational configurations. Thus, the active mode 302-1 can be used, for example, with mission-mode activities, such as user-data communication, and higher-bandwidth modulation schemes.

Figures 1, 4:
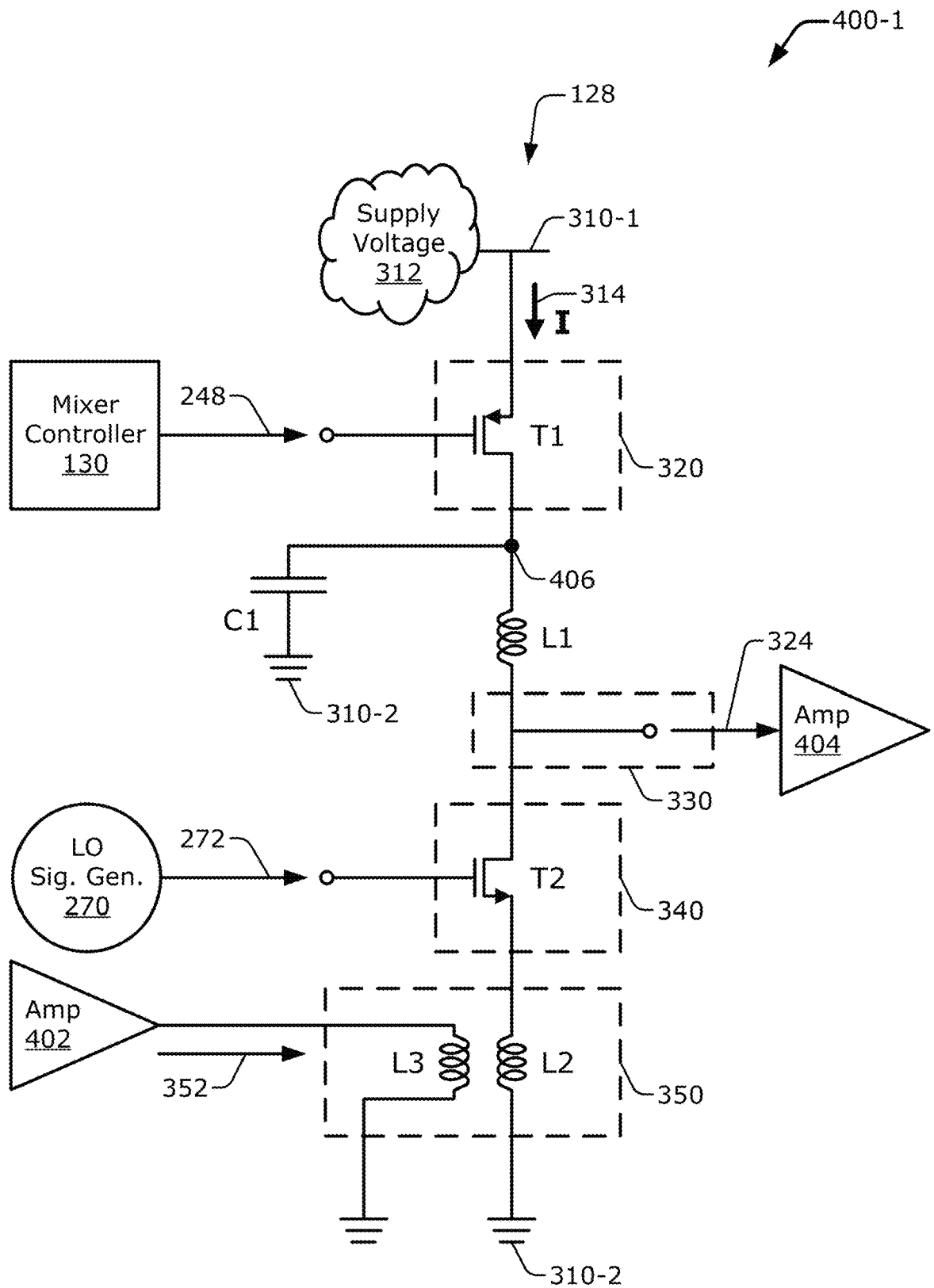
Figures 2, 4:
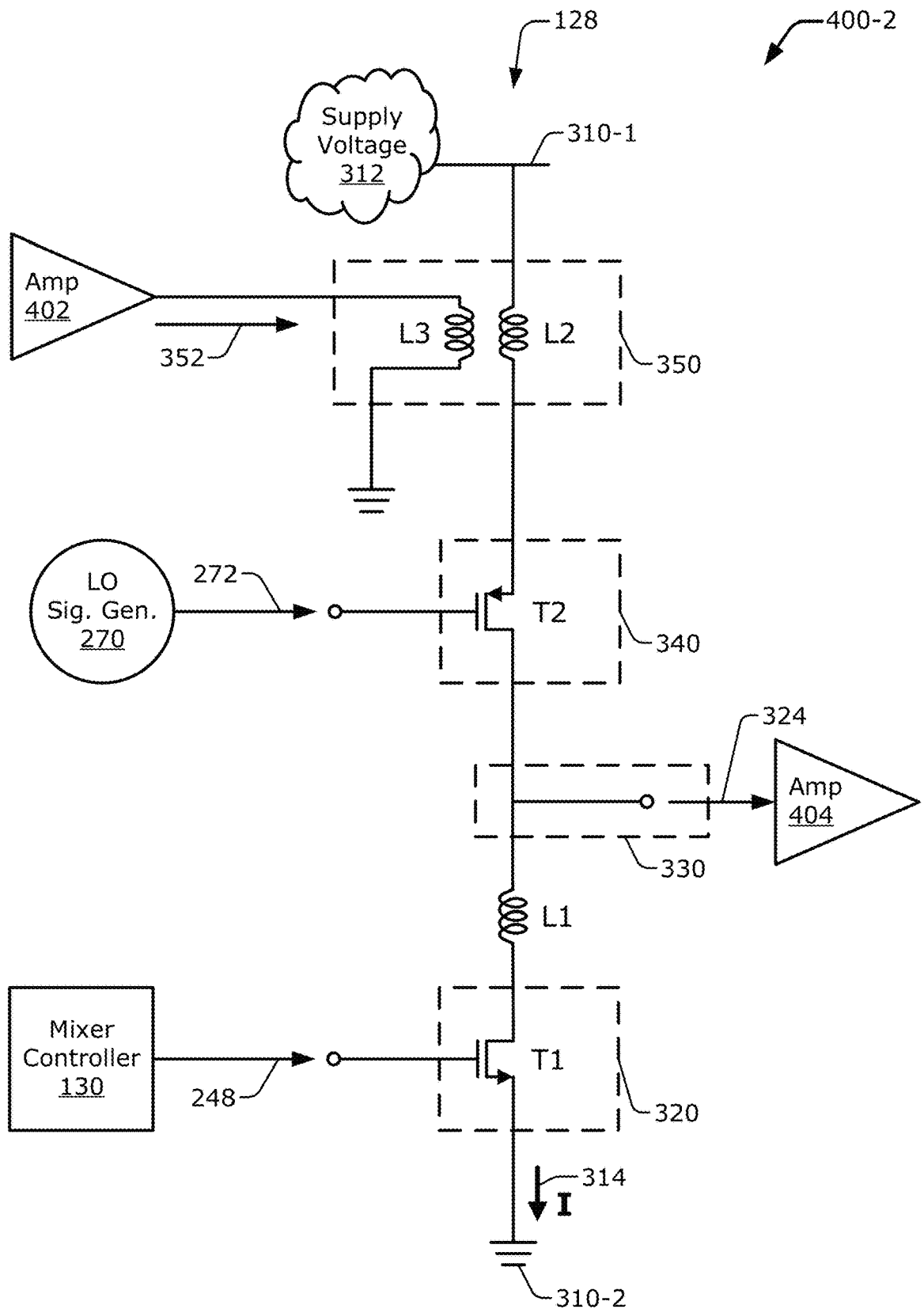

The multi-mode mixer 128 depicted in FIGS. 3 to 3-3 and described above can be realized using many different circuitry implementations. Some example implementations are illustrated in FIGS. 4-1 to 6 and described below. FIGS. 4-1 and 4-2 depict example single-ended implementations, and FIGS. 5-1, 5-2, and 6 depict example differential implementations. The implementations illustrated in FIGS. 4-1, 5-1, and 6 realize a current control switch 320 using a "header switch," and the implementations illustrated in FIGS. 4-2 and 5-2 realize a current control switch 320 using a "footer switch." However, a multi-mode mixer 128 can be implemented using alternative circuitry, including combinations of the circuitries shown in FIGS. 4-1 to 6. For example, the components can be arranged in different orders between a voltage rail and a ground plane of a power distribution network 310 (e.g., the order differs between the "header switch" implementation of FIG. 4-1 as compared to the "footer switch" implementation of FIG. 4-2).

FIG. 4-1 illustrates an example frequency translation architecture 400-1 with single-ended circuitry and a current control switch 320 coupled nearer a power supply node 310-1. In this example for FIGS. 4-1 and 4-2, amplifiers are used as an example of an adjacent upstream component and an adjacent downstream component along a component chain that includes the multi-mode mixer 128. Thus, an amplifier is coupled to both an input and an output of the multi-mode mixer 128. An amplifier 402 (Amp 402) provides the second signal 352 as the input to the multi-mode mixer 128, and an amplifier 404 (Amp 404) accepts the first signal 324 as the output of the multi-mode mixer 128. Here, the multi-mode mixer 128 is performing a frequency down-conversion. However, in other implementations, the multi-mode mixer 128 may be coupled to a different upstream or downstream component, communication signal flow may be in the opposite direction, a frequency up-conversion operation may be performed, or some combination thereof.

As shown, the multi-mode mixer 128 includes the power distribution network 310, the current control switch 320, the first data signal coupler 330, the mixer core 340, and the second data signal coupler 350. In some implementations, the power distribution network 310 includes a power supply rail and a ground plane (not explicitly shown). Here, the multi-mode mixer 128 includes a power supply node 310-1, which is part of the power supply rail, and a ground node 310-2, which is part of the ground plane. The current control switch 320, the first data signal coupler 330, the mixer core 340, and the second data signal coupler 350 are coupled together in series between the power supply node 310-1 and the ground node 310-2 along a series path 360 (of FIG. 3). When the multi-mode mixer 128 is powered, the power distribution network 310 provides a supply voltage 312 (of FIG. 3). The power, ground, and other reference voltage rails may be located on different planes (e.g., of a printed circuit board (PCB) or an integrated circuit (IC)) to improve the signal integrity of the multi-mode mixer 128.

In the frequency translation architecture 400-1, the current control switch 320 is disposed between the power supply node 310-1 and the mixer core 340 to function analogously to a "header switch" for DC current. The current control switch 320 is realized as a transistor T1 that is implemented as a p-type transistor. The transistor T1 includes a source terminal, a drain terminal, and a gate terminal. The gate terminal is coupled to the mixer controller 130 to accept the mode control signal 248. The source terminal of the transistor T1 is coupled to the power supply node 310-1, and the drain terminal is coupled to the first data signal coupler 330, which may be coupled via an inductor L1. Accordingly, to establish the active mode 302-1, the mixer controller 130 generates a low voltage for the mode control signal 248 to turn on the transistor T1 and cause the current control switch 320 to be in a closed state that enables the current 314 to flow along the series path 360 (of FIG. 3). To establish the passive mode 302-2, the mixer controller 130 generates a high voltage for the mode control signal 248 to turn off the transistor T1 and cause the current control switch 320 to be in an open state that prevents the current 314 from flowing.

With this single-ended circuitry, the mixer core 340 is realized with a transistor T2 that is implemented as an n-type transistor. The transistor T2 includes a source terminal, a drain terminal, and a gate terminal. The gate terminal is coupled to the LO signal generator 270 to accept the LO signal 272. In the operational state 306, for both the active mode 302-1 and the passive mode 302-2, a DC bias voltage (not shown) can be applied to the gate terminal of the transistor T2 to bias the transistor T2 into a DC operational range. This bias voltage enables the current 314 to flow through the transistor T2 in the active mode 302-1; nevertheless, this bias voltage can also be maintained at the gate terminal of the transistor T2 during the passive mode 302-2. The drain terminal of the transistor T2 is coupled to the first data signal coupler 330, and the source terminal is coupled to the second data signal coupler 350. The second data signal coupler 350 is implemented as a transformer having an inductor L3 and an inductor L2 that are electromagnetically coupled together.

Alternatively, the second data signal coupler 350 can be implemented with one inductor while another inductor is provided by an adjacent component. In general, the transistor T1 of the current control switch 320, or another transistor described herein such as the transistor T2, may be implemented using a metal-oxide-semiconductor field-effect transistor (MOSFET), a complementary metal-oxide-semiconductor (CMOS) transistor, a bipolar junction transistor (BJT), and so forth. In the drawings, a fourth (body) terminal is omitted for simplicity. Further, either or both of the drain terminal or the source terminal of a given transistor may be referred to as a channel terminal of the transistor, such as a first channel terminal or a second channel terminal.

In example implementations, the mixer controller 130 selects or establishes the active mode 302-1 or the passive mode 302-2 of the multi-mode mixer 128 using the mode control signal 248. If the mode control signal 248 turns on the transistor T1 to close the current control switch 320, a DC current 314 flows from the source terminal through a channel to the drain terminal of the transistor T1. In such an instance, the multi-mode mixer 128 is operating in the active mode 302-1. In contrast, if the mixer controller 130 uses the mode control signal 248 to turn off the transistor T1 to open the current control switch 320, the current control switch 320 blocks the DC current 314 from flowing (e.g., the current 314 is negligible or approximately zero). In such an instance, the multi-mode mixer 128 is operating in the passive mode 302-2. Thus, in the passive mode 302-2, except for some current leakage, the current 314 is not flowing through the components of the multi-mode mixer 128, and the multi-mode mixer 128 consumes less power than in the active mode 302-1.

In an example operation, the second signal 352 is electromagnetically coupled from the inductor L3 to the inductor L2. The inductor L2 is coupled to the source terminal of the transistor T2 of the mixer core 340. The transistor T2 of the mixer core 340 down-converts the second signal 352 that is at one frequency to another, lower frequency to produce the first signal 324 based on a frequency of the LO signal 272. An inductor L1 is coupled between the first data signal coupler 330 and the current control switch 320. The inductor L1 functions as a load of the mixer core 340, and an inductive value of the inductor L1 can be set based on the frequency of operation. A capacitor C1 is coupled between the ground node 310-2 and a node 406 located between the inductor L1 and the current control switch 320. The capacitor C1 functions as a supply bypass. Thus, the capacitor C1 can attenuate or divert alternating-current (AC) signals present at the first data signal coupler 330 to substantially prevent these signals from reaching the current control switch 320. If the multi-mode mixer 128 is operating in the active mode 302-1, the transistor T1 of the current control switch 320 is turned on, and the DC current 314 flows from the power supply node 310-1, through the channels of the transistors T1 and T2, through the inductors L1 and L2, and to the ground node 310-2.

FIG. 4-2 illustrates another example frequency translation architecture 400-2 with single-ended circuitry and a current control switch 320 coupled nearer a ground node 310-2. The frequency translation architecture 400-2 is similar to the frequency translation architecture 400-1 of FIG. 4-1. For instance, the current control switch 320, the first data signal coupler 330, the mixer core 340, and the second data signal coupler 350 are coupled together in series between the power supply node 310-1 and the ground node 310-2. However, in the frequency translation architecture 400-2, the current control switch 320 is disposed between the mixer core 340 and the ground node 310-2 to function analogously to a "footer switch" for the direct current (DC) current. Thus, the current control switch 320 is realized as a transistor T1 that is implemented as an n-type transistor.

The transistor T1 includes a source terminal, a drain terminal, and a gate terminal. The gate terminal is coupled to the mixer controller 130 to accept the mode control signal 248. The source terminal of the transistor T1 is coupled to the ground node 310-2, and the drain terminal is coupled to the first data signal coupler 330. Accordingly, to establish the active mode 302-1, the mixer controller 130 generates a high voltage for the mode control signal 248 to turn on the transistor T1 and cause the current control switch 320 to be in a closed state that enables the current 314 to flow along the series path 360 (of FIG. 3). On the other hand, to establish the passive mode 302-2, the mixer controller 130 generates a low voltage for the mode control signal 248 to turn off the transistor T1 and cause the current control switch 320 to be in an open state that prevents the current 314 from flowing.

With this single-ended circuitry in which the current control switch 320 is realized as a "footer switch," the mixer core 340 is realized with a transistor T2 that is implemented as a p-type transistor. The transistor T2 includes a source terminal, a drain terminal, and a gate terminal. The gate terminal is coupled to the LO signal generator 270 to accept the LO signal 272. In the operational state 306, for both the active mode 302-1 and the passive mode 302-2, a DC bias voltage (not shown) can also be applied to the gate terminal of the transistor T2 to bias the transistor T2 into a DC operational range. The source terminal of the transistor T2 is coupled to the second data signal coupler 350, and the drain terminal is coupled to the first data signal coupler 330. In operation, the second signal 352 is electromagnetically coupled from the inductor L3 to the inductor L2. The inductor L2 is coupled to the source terminal of the transistor T2 of the mixer core 340. The transistor T2 of the mixer core 340 down-converts the second signal 352 that is at one frequency to another, lower frequency to produce the first signal 324 based on a frequency of the LO signal 272. If the multi-mode mixer 128 is operating in the active mode 302-1, the transistor T1 of the current control switch 320 is turned on by the mode control signal 248. Thus, the DC current 314 flows from the power supply node 310-1, through the inductor L2 and the transistor T2, through the inductor L1 and the transistor T1, and then to the ground node 310-2.

Figures 1, 5:
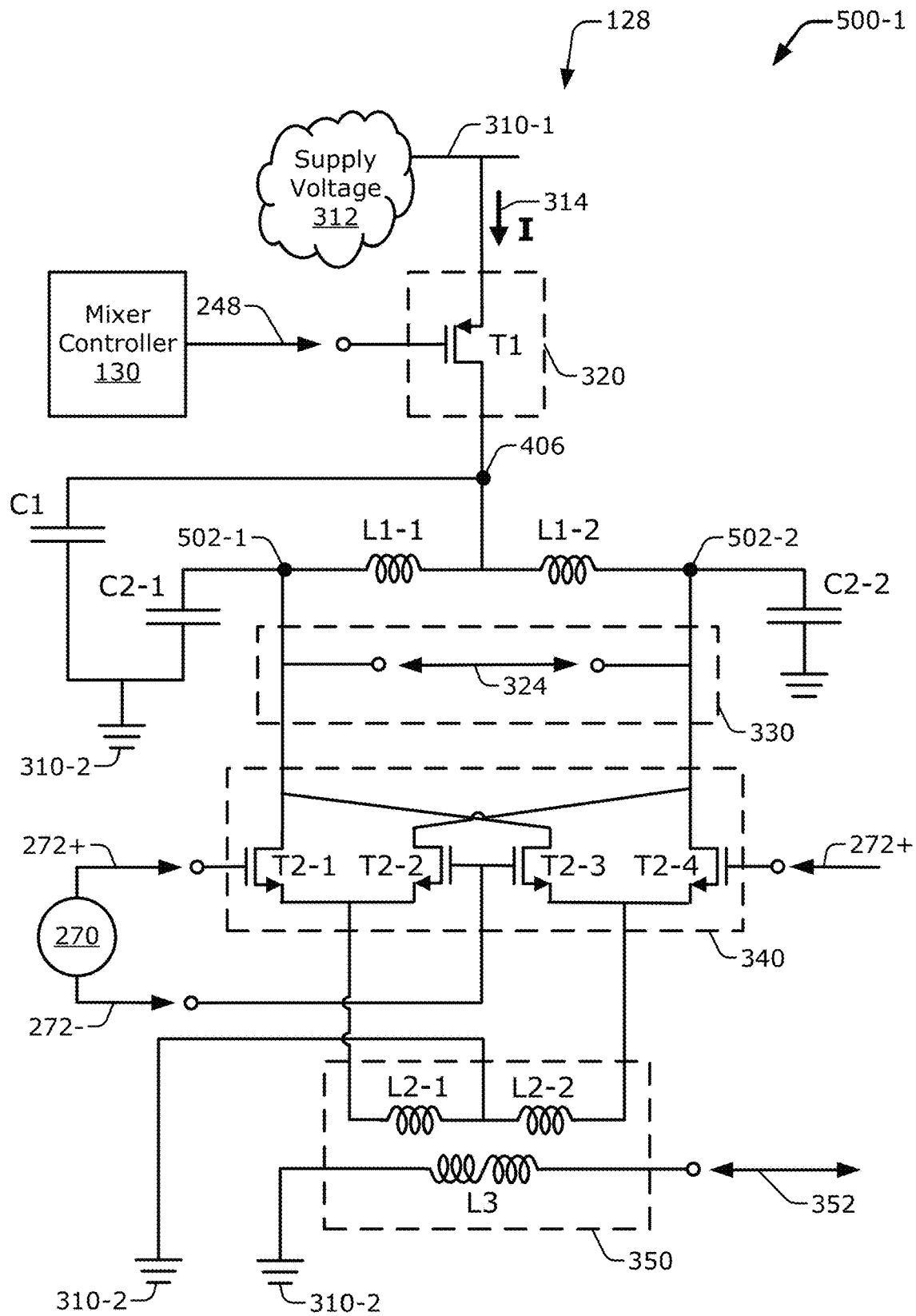
Figures 2, 5:
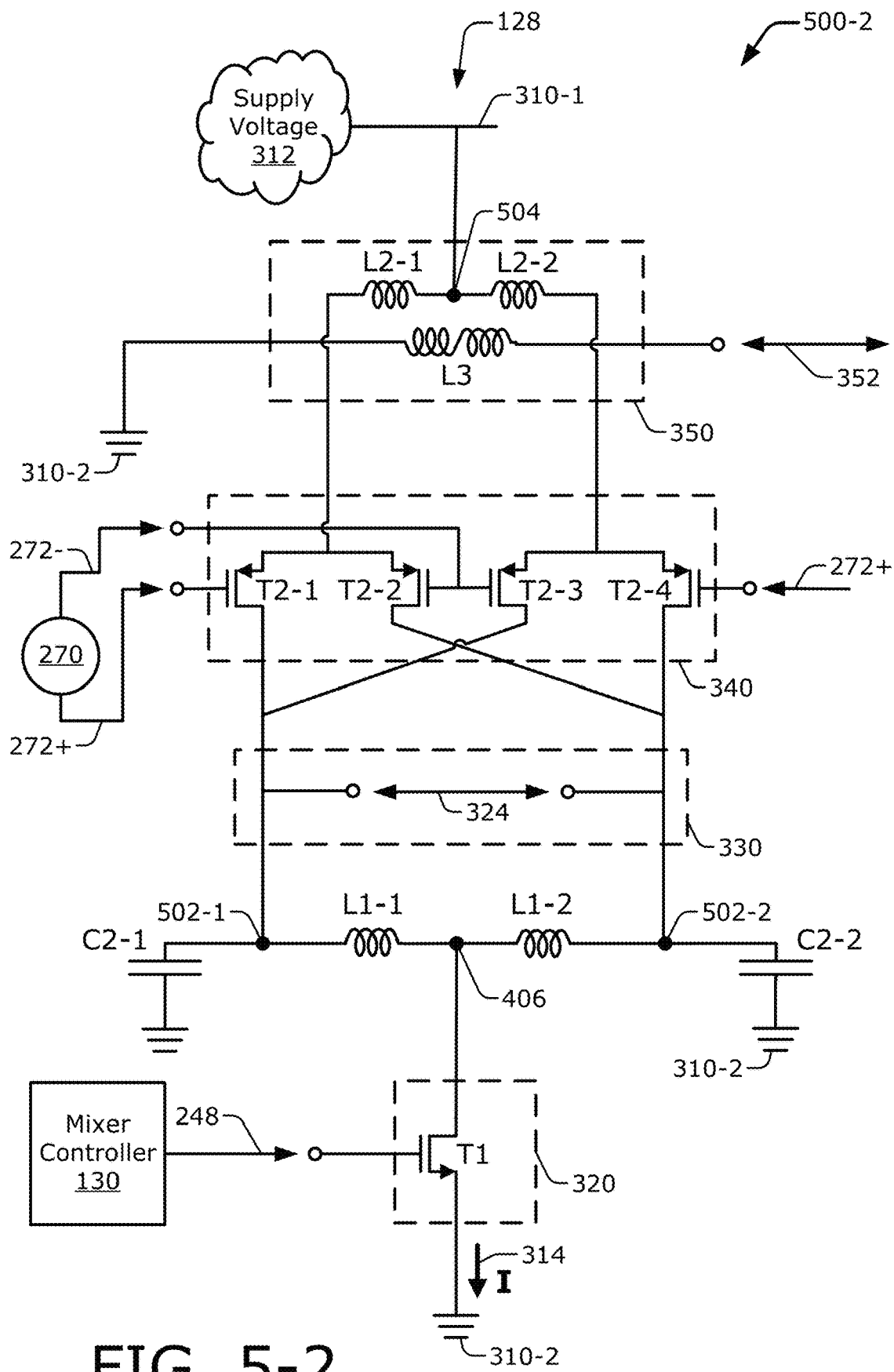
Figure 6:
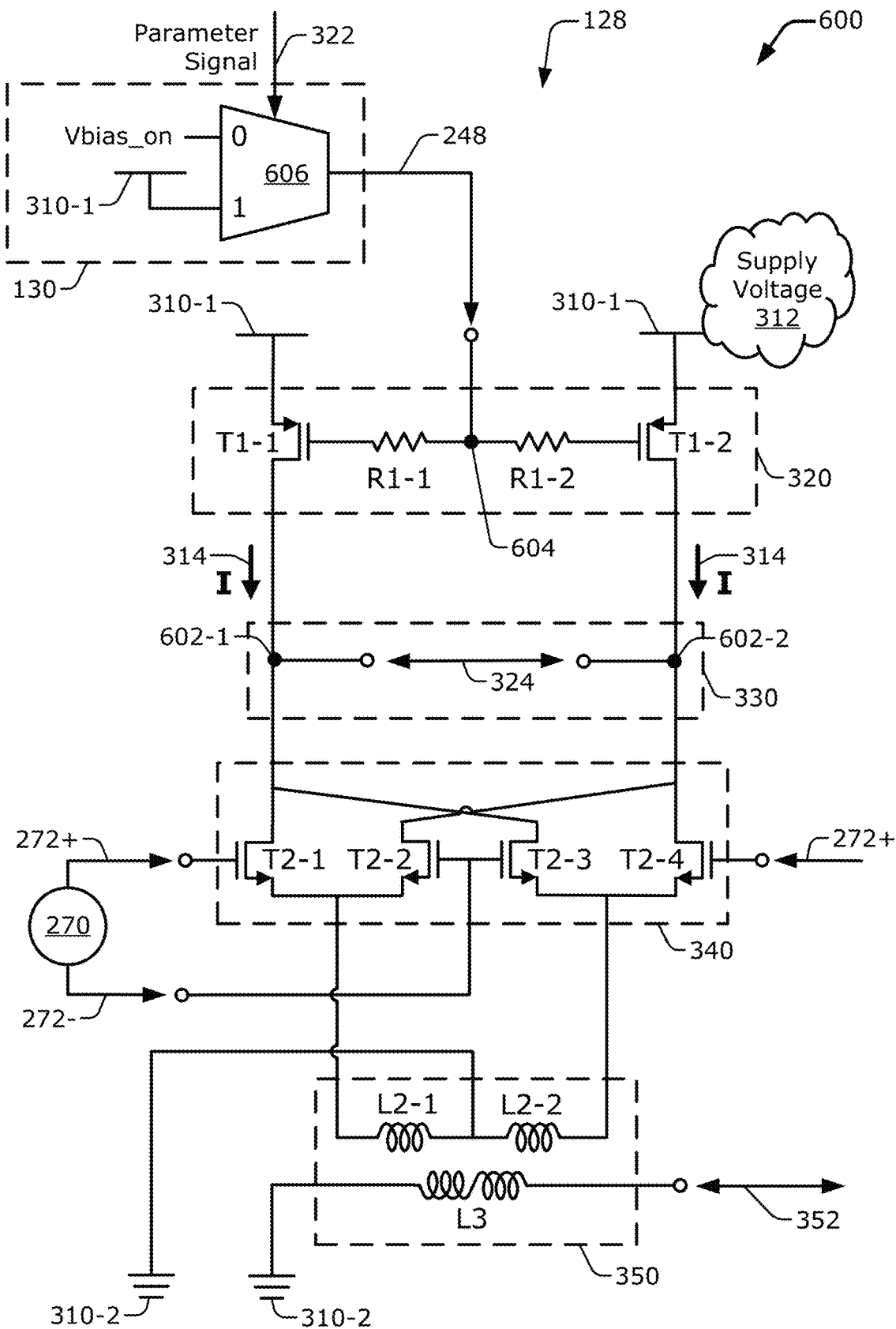
FIG. 6 illustrates another example frequency translation architecture with differential circuitry and with a differential implementation of a current control switch that is coupled nearer a power supply node.

FIG. 5-1 illustrates an example frequency translation architecture 500-1 with differential circuitry and a current control switch 320 coupled nearer a power supply node 310-1. The frequency translation architecture 500-1 is similar to the frequency translation architecture 400-1 of FIG. 4-1. For example, the current control switch 320, the first data signal coupler 330, the mixer core 340, and the second data signal coupler 350 are coupled together in series between the power supply node 310-1 and the ground node 310-2 along a series path 360 (of FIG. 3). Further, the current control switch 320 of the multi-mode mixer 128 is realized as a transistor T1 that is implemented as a p-type transistor and is configured as a "header switch" with respect to DC current. However, at least the mixer core 340 is implemented using differential circuitry. As shown in FIG. 5-1, the first data signal coupler 330 and the second data signal coupler 350 are also implemented using differential circuitry.

In example implementations for differential circuitry, the inductor L1 of FIG. 4-1 is implemented as two inductors L1-1 and L1-2 as part of the load of the mixer core 340. This load also includes two capacitors C2-1 and C2-2. The inductor L1-1 is coupled between the current control switch 320 and a node 502-1 (e.g., a plus node), and the capacitor C2-1 is coupled between the node 502-1 and the ground node 310-2. The inductor L1-2 is coupled between the current control switch 320 and a node 502-2 (e.g., a minus node), and the capacitor C2-2 is coupled between the node 502-2 and the ground node 310-2. The first data signal coupler 330 is coupled between the node 502-1 and the node 502-2. The supply bypass capacitor C1 is coupled between the node 406, which can be co-located with the drain terminal of the transistor T1 or between the load inductors L1-1 and L1-2, and the ground node 310-2.

To perform a frequency translation operation on a differential signal, the mixer core 340 is implemented as a differential mixer core that includes at least two transistors T2. In this example, the differential circuitry of the mixer core 340 is implemented in a double-balanced configuration. Thus, the double-balanced differential mixer core 340 includes at least four transistors: a transistor T2-1, a transistor T2-2, a transistor T2-3, and a transistor T2-4. Each of the four transistors T2-1 to T2-4 is implemented as an n-type transistor. One pair of transistors, the transistors T2-1 and T2-2, is cross-coupled with another pair of transistors, the transistors T2-3 and T2-4. Each of the drain terminals of the transistors T2-1 and T2-3 is coupled to the node 502-1, and each of the drain terminals of the transistors T2-2 and T2-4 is coupled to the node 502-2.

The LO signal generator 270 produces a differential LO signal 272 that includes a plus LO signal 272+ and a minus LO signal 272−. Each of the gate terminals of the transistors T2-1 and T2-4 is coupled to a plus output of the LO signal generator 270 to receive the plus LO signal 272+. Each of the gate terminals of the transistors T2-2 and T2-3 is coupled to a minus output of the LO signal generator 270 to receive the minus LO signal 272−. Each of the source terminals of each of the multiple transistors T2-1 to T2-4 is coupled to the second data signal coupler 350. With the second data signal coupler 350 of FIG. 5-1, the inductor L2 of FIG. 4-1 is implemented as two inductors L2-1 and L2-2 with a center tap that is coupled to the ground node 310-2 to provide a DC path to ground. Each of the source terminals of the transistors T2-1 and T2-2 is coupled to the inductor L2-1, and each of the source terminals of the transistors T2-3 and T2-4 is coupled to the inductor L2-2.

In an example operation for a frequency down-conversion operation, a single-ended version of the second signal 352 is electromagnetically coupled from the inductor L3 to the inductors L2-1 and L2-2. This converts the propagating signal to a differential-version of the second signal 352. The inductor L2-1 and the inductor L2-2 are coupled to respective source terminals of the two transistors T2-1 and T2-2 and of the two transistors T2-3 and T2-4 of the mixer core 340. The four transistors T2-1, T2-2, T2-3, and T2-4 of the mixer core 340 down-convert the second signal 352 that is at one, higher frequency to another, lower frequency to produce a differential version of the first signal 324 at the first data signal coupler 330. The inductors L1-1 and L1-2 and the capacitors C2-1 and C2-2 function as a load of the mixer core 340, so inductive values of the inductors and capacitive values of the capacitors can be set based on a frequency of operation. The capacitor C1 can attenuate or divert alternating-current (AC) signals present at the first data signal coupler 330 to substantially prevent these signals from reaching the current control switch 320. If the multi-mode mixer 128 is operating in the active mode 302-1, the transistor T1 of the current control switch 320 is turned on. If the transistor T1 is turned on, the DC current 314 flows from the power supply node 310-1, flows through a channel of the transistor T1, is split or divided to flow through the inductors L1-1 and L1-2, is further split or divided to flow through channels of the four transistors T2-1 to T2-4, is partially recombined to flow through the inductors L2-1 and L2-2, and is then "fully" recombined to flow to the ground node 310-2.

In these manners, a multi-mode mixer 128 can be realized with differential signaling using a double-balanced differential implementation of a mixer core 340. Alternatively, a multi-mode mixer 128 can be realized with differential signaling using a single-balanced differential implementation of a mixer core 340. To do so, the two transistors T2-2 and T2-3 are removed. Further, the minus LO signal 272− is coupled to the gate terminal of the transistor T2-4, instead of the plus LO signal 272+.

FIG. 5-2 illustrates another example frequency translation architecture 500-2 with differential circuitry and a current control switch 320 coupled nearer a ground node 310-2. The frequency translation architecture 500-2 is similar to the frequency translation architecture 500-1 of FIG. 5-1. For instance, the current control switch 320, the first data signal coupler 330, the mixer core 340, and the second data signal coupler 350 of the multi-mode mixer 128 are coupled together in series between the power supply node 310-1 and the ground node 310-2 along the series path 360 (of FIG. 3). However, in the frequency translation architecture 500-2, the current control switch 320 is disposed between the mixer core 340 and the ground node 310-2 to function analogously to a "footer switch" in terms of DC current. Thus, the current control switch 320 is realized as a transistor T1 that is implemented as an n-type transistor. Specifically, a drain terminal of the transistor T1 is coupled to a node 406 that is located between the two inductors L1-1 and L1-2, and a source terminal of the transistor T1 is coupled to the ground node 310-2.

Each of the transistors T2-1 to T2-4 is implemented as a p-type transistor having channel terminals that are coupled between the first data signal coupler 330 and the second data signal coupler 350. Specifically, the source terminals of the transistors T2-1 to T2-4 are coupled to the second data signal coupler 350, and the drain terminals of the transistors T2-1 to T2-4 are cross-coupled to the first data signal coupler 330 to drive the load as realized by the inductors L1-1 and L1-2 and the capacitors C2-1 and C2-2. If the multi-mode mixer 128 is operating in the active mode 302-1, the transistor T1 of the current control switch 320 is turned on. If the transistor T1 is turned on, the DC current 314 flows from the power supply node 310-1, is split or divided at a node 504 to flow through both the inductors L2-1 and L2-2, is further split or divided at the source terminals to flow through the channels of the four transistors T2-1 to T2-4, is partially recombined at the drain terminals thereof to flow through the inductors L1-1 and L1-2, is "fully" recombined at the node 406 to flow through a channel of the transistor T1, and then flows to the ground node 310-2.

FIG. 6 illustrates another example frequency translation architecture 600 with differential circuitry and with a differential implementation of a current control switch 320 that is coupled nearer a power supply node 310-1. The frequency translation architecture 600 is similar to the frequency translation architecture 500-1 of FIG. 5-1. For instance, the current control switch 320, the first data signal coupler 330, the mixer core 340, and the second data signal coupler 350 of the multi-mode mixer 128 are coupled together in series along a series path 360 (of FIG. 3) between at least one power supply node 310-1 and at least one ground node 310-2. However, in the frequency translation architecture 600, the current control switch 320 includes two transistors T1-1 and T1-2 to implement a differential version of the current control switch 320. These two transistors T1-1 and T1-2 are realized as p-type transistors. Thus, a drain terminal of each of the transistors T1-1 and T1-2 is coupled respectively to a node 602-1 (e.g., a plus node) and a node 602-2 (e.g., a minus node). A source terminal of each of the transistors T1-1 and T1-2 is coupled to at least one power supply node 310-1 of a power rail (not explicitly shown).

A respective bias resistor R1-1 and R1-2 is coupled between a respective gate terminal of each of the transistors T1-1 and T1-2 and a node 604. The mixer controller 130 controls whether the multi-mode mixer 128 is operating in the active mode 302-1 or the passive mode 302-2 by coupling the mode control signal 248 to the node 604 based on the parameter signal 322. In the illustrated implementation, the mixer controller 130 includes a multiplexer 606 (MUX) with two inputs. One input biases the transistors T1-1 and T1-2 into an on state, and the other input biases the two transistors into an off state. For p-type transistors, the on-bias voltage level corresponds to a low voltage, such as ground, and the off-bias voltage level corresponds to a high voltage, such as a supply voltage from the power supply node 310-1. A value of the parameter signal 322 selects which input of the multiplexer 606 is coupled to the output thereof as the mode control signal 248. Alternative implementations for the mixer controller 130 include a switch, a voltage divider with an adjustable divider ratio, and so forth. Further, in other implementations, the mixer controller 130 may include additional circuitry to determine the mode control signal 248 based on multiple parameter signals 322.

In example operation, each of the two transistors T1-1 and T1-2 can function or be configured as a current source that is biased to source current in the active mode 302-1. This causes the current 314 to "start" in a split condition before being further split by the four transistors T2-1 to T2-4 and then recombined in stages both before and after the two inductors L2-1 and L2-2 on the path toward the ground node 310-2. In contrast, the two transistors T1-1 and T1-2 are switched off in the passive mode 302-2. In the example frequency translation architecture 600, like with the other frequency translation architectures described above, a DC bias voltage can be applied to the gates of the four transistors T2-1 to T2-4 of the mixer core 340 in the passive mode 302-2 to enable faster switching.

The frequency translation architecture 600 of FIG. 6 can be used, for example, in a ZIF/OZIF system. With relatively-relaxed constraints on the mixer, the LO signal 272 can be applied to the mixer core 340 with a 50% duty cycle that is not driven rail-to-rail using the active mode 302-1 and the passive mode 302-2, as described herein above. However, in a ZIF/OZIF system with more stringent constraints on the mixer, the higher performance operation would correspond to the passive mode 302-2. Here, the mixer core 340 is driven with a rail-to-rail square wave with a 25% duty-cycle LO signal 272. In the lower-power active mode 302-1 with DC current 314 flowing, the gate terminals of the transistors T2-1 to T2-4 are driven with a sinusoidal wave form with a lower amplitude. This improves current consumption relative to the power-hungry rail-to-rail I/Q LO signal swing with less DC current 314. In other words, utilizing a 25% duty cycle appreciably increases the power consumption for the passive mode 302-2. However, using the sinusoidal waveform with the lower amplitude can provide a lower-power operation for the active mode 302-1, but at the cost of increased flicker noise.

Although this example frequency translation architecture 600 is depicted and described in a particular manner, the differential current control switch 320 can be implemented in other manners. For example, the differential current control switch 320 can be realized as a "footer switch" with respect to a DC current 314 to implement two current sinks nearer the ground node 310-2, instead of the illustrated current sources for a "header switch." Further, the mixer core 340 can be implemented with single-balanced differential circuitry, with single-ended circuitry, and so forth.

Figure 7:
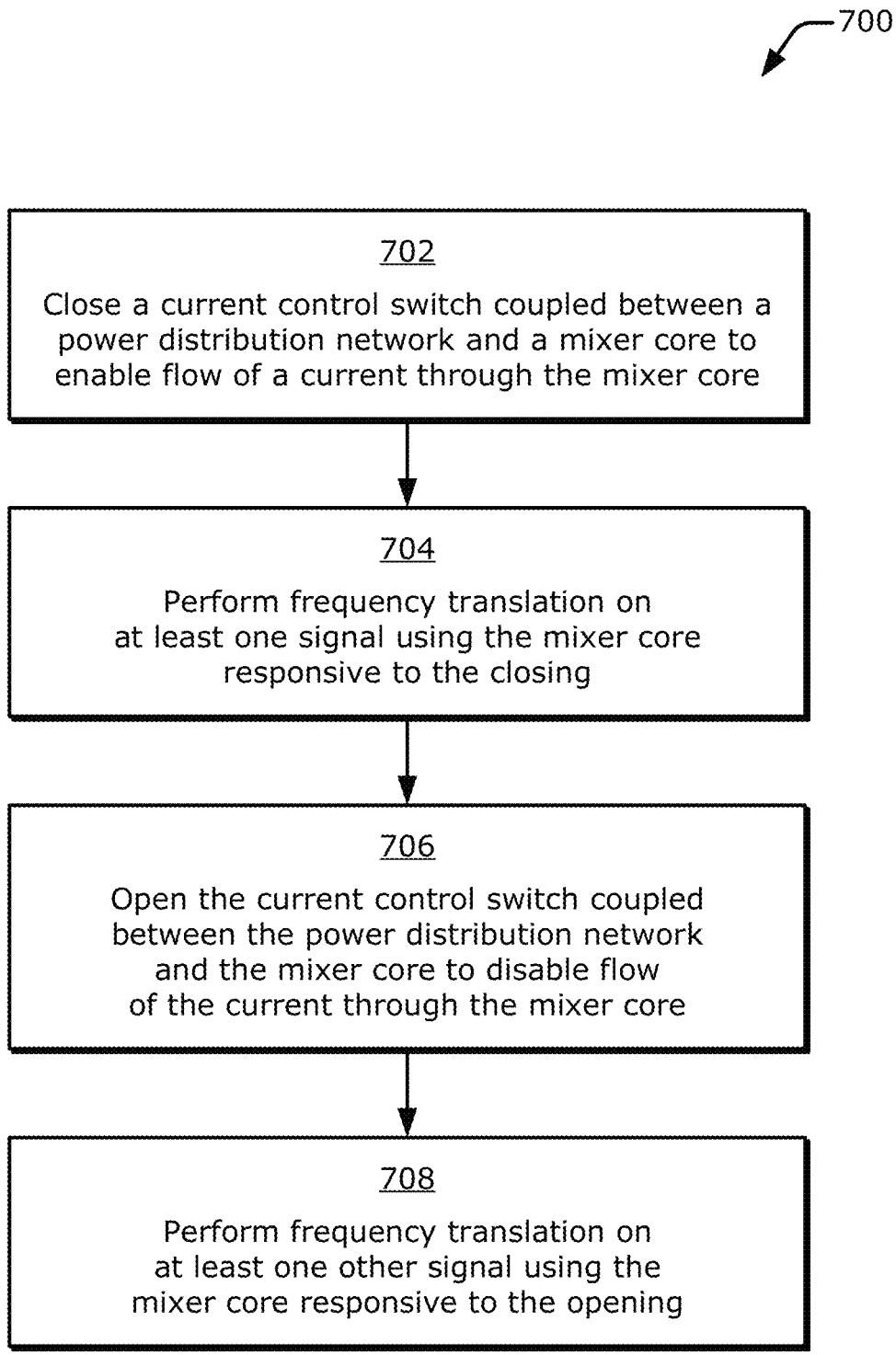
FIG. 7 is a flow diagram illustrating an example process for operating a multi-mode mixer.

FIG. 7 is a flow diagram illustrating an example process 700 for mixing signals for frequency translation. The process 700 is described in the form of a set of blocks 702-708 that specify operations that can be performed. However, operations are not necessarily limited to the order shown in FIG. 7 or described herein, for the operations may be implemented in alternative orders or in fully or partially overlapping manners. Also, more, fewer, and/or different operations may be implemented to perform the process 700, or an alternative process. Operations represented by the illustrated blocks of the process 700 may be performed by a transceiver 126 or a portion thereof in conjunction with a communication processor 124 (e.g., of FIG. 2), such as by a multi-mode mixer 128 responding to commands from a mixer controller 130. More specifically, the operations of the process 700 may be performed by a current control switch 320 and a mixer core 340.

At block 702, a current control switch coupled between a power distribution network and a mixer core is closed to enable flow of a current through the mixer core. For example, a mixer controller 130 can close a current control switch 320 coupled between a power distribution network 310 and a mixer core 340 to enable flow of a current 314 through the mixer core 340. For instance, a mode control signal 248 from the mixer controller 130 may turn on at least one transistor T1 of the current control switch 320 to enable the current 314 to flow along a series path 360, including through channels of the transistor T1 and at least one transistor T2 of the mixer core 340.

At block 704, frequency translation is performed on at least one signal using the mixer core responsive to the closing. For example, a multi-mode mixer 128 can perform frequency translation on at least one signal (e.g., a first signal 324 or a second signal 352) using the mixer core 340 responsive to the closing. This frequency translation may be performed by applying an active local oscillator signal 272 to a gate terminal of the transistor T2 of the mixer core 340 while the current 314 flows through the channel of the transistor T2.

At block 706, the current control switch coupled between the power distribution network and the mixer core is opened to disable flow of the current through the mixer core. For example, the mixer controller 130 can open the current control switch 320 coupled between the power distribution network 310 and the mixer core 340 to disable flow of the current 314 through the mixer core 340. In some cases, the mode control signal 248 can turn off the transistor T1 to substantially block at least a DC portion of the current 314 from reaching the channel of the transistor T2 of the mixer core 340.

At block 708, frequency translation is performed on at least one other signal using the mixer core responsive to the opening. For example, the multi-mode mixer 128 can perform frequency translation on at least one other signal (e.g., a first signal 324 or a second signal 352 at a different time) using the mixer core 340 responsive to the opening. For instance, the multi-mode mixer 128 can effect a frequency translation between the first signal 324 and the second signal 352 by applying the active local oscillator signal 272 to the gate terminal of the transistor T2 of the mixer core 340 while at least the DC portion of the current 314 is blocked from reaching the channel of the transistor T2.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for mixing signals, the apparatus comprising:
    a multi-mode mixer comprising:
        a supply voltage node;
        a ground node;
        a first data signal coupler;
        a second data signal coupler;
        a mixer core coupled between the first data signal coupler and the second data signal coupler; and
        a current control switch configured to selectively enable or disable flow of a current through the mixer core,
        the first data signal coupler, the second data signal coupler, the mixer core, and the current control switch coupled together in series between the supply voltage node and the ground node to establish a series path; a portion of the series path extending between the first data signal coupler and the second data signal coupler, the portion of the of the series path including the mixer core; the current control switch coupled between the supply voltage node and the ground node outside the portion of the series path that extends between the first data signal coupler and the second data signal coupler and that includes the mixer core.

2. The apparatus of claim 1, wherein the current comprises a direct-current (DC) current.

3. The apparatus of claim 2, wherein the current control switch is configured to enable and disable flow of the DC current through the mixer core and between the supply voltage node and the ground node along the series path.

4. The apparatus of claim 1, wherein the current control switch is configured to enable flow of the current through the mixer core while a first signal at the first data signal coupler has a changing voltage level.

5. The apparatus of claim 1, wherein the current control switch is configured to disable flow of the current through the mixer core while a first signal at the first data signal coupler has a changing voltage level.

6. The apparatus of claim 1, wherein the current control switch is configured to:
    enable flow of the current through the mixer core while an active local oscillator signal is applied to the mixer core at one time; and
    disable flow of the current through the mixer core while the active local oscillator signal is applied to the mixer core at another time.

7. The apparatus of claim 1, further comprising:
    a mixer controller configured to cause the multi-mode mixer to selectively operate in an active mode or a passive mode, wherein:
        the active mode corresponds to the current being enabled to flow through the mixer core; and
        the passive mode corresponds to the current being disabled from flowing through the mixer core.

8. The apparatus of claim 7, wherein the mixer controller is configured to:
    close the current control switch to establish the active mode; and
    open the current control switch to establish the passive mode.

9. The apparatus of claim 1, wherein the current control switch is coupled between the supply voltage node and the mixer core along the series path.

10. The apparatus of claim 1, wherein the current control switch is coupled between the mixer core and the ground node along the series path.

11. The apparatus of claim 1, wherein the current control switch comprises at least one transistor.

12. The apparatus of claim 11, wherein the at least one transistor of the current control switch comprises at least two transistors, each transistor of the at least two transistors configured as a current source.

13. The apparatus of claim 1, wherein the mixer core comprises a differential mixer core that comprises at least two transistors coupled between the first data signal coupler and the second data signal coupler.

14. The apparatus of claim 13, wherein the multi-mode mixer is configured to apply a bias voltage to a gate terminal of each of the at least two transistors to operate in an active mode or to operate in a passive mode.

15. The apparatus of claim 13, wherein the differential mixer core comprises a double-balanced differential mixer core that comprises at least four transistors coupled between the first data signal coupler and the second data signal coupler.

16. The apparatus of claim 1, wherein the first data signal coupler comprises at least one of an inductor or a capacitor.

17. The apparatus of claim 1, wherein the mixer core is configured to perform at least one frequency conversion operation, comprising a frequency up-conversion operation or a frequency down-conversion operation, on a signal propagating between the first data signal coupler and the second data signal coupler.

18. The apparatus of claim 17, wherein the at least one frequency conversion operation comprises at least one of:
 a conversion between radio frequency (RF) and intermediate frequency (IF);
 a conversion between IF and baseband frequency; or
 a direct conversion between RF and baseband frequency.

19. The apparatus of claim 1, further comprising:
 an antenna array comprising multiple antenna elements, the multi-mode mixer coupled to at least one antenna element of the multiple antenna elements; and
 a wireless interface device coupled to the antenna array, the wireless interface device comprising the multi-mode mixer and configured to process signals communicated via the antenna array.

20. The apparatus of claim 19, further comprising:
 a display screen; and
 a processor operably coupled to the display screen and the wireless interface device, the processor configured to present one or more graphical images on the display screen based on the signals communicated via the antenna array and processed via the wireless interface device using the multi-mode mixer.

21. The apparatus of claim 1, wherein the mixer core is configured to perform at least one frequency conversion operation responsive to the current being enabled to flow through the mixer core and responsive to the current being disabled from flowing through the mixer core.

\* \* \* \* \*